United States Patent
Neti et al.

(10) Patent No.: US 11,087,920 B2
(45) Date of Patent: Aug. 10, 2021

(54) SYSTEM AND METHOD FOR TRANSFORMER CONTROL

(71) Applicant: GENERAL ELECTRIC COMPANY, Schenectady, NY (US)

(72) Inventors: Prabhakar Neti, Rexford, NY (US); Karim Younsi, Ballston lake, NY (US); Deepak Aravind, Bangalore (IN)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 534 days.

(21) Appl. No.: 15/941,070

(22) Filed: Mar. 30, 2018

(65) Prior Publication Data

US 2019/0304673 A1  Oct. 3, 2019

(51) Int. Cl.
*H01F 27/42* (2006.01)
*H01F 27/12* (2006.01)
*G01R 31/62* (2020.01)
*G01R 19/25* (2006.01)

(52) U.S. Cl.
CPC ............ *H01F 27/42* (2013.01); *G01R 31/62* (2020.01); *H01F 27/12* (2013.01); *G01R 19/2513* (2013.01)

(58) Field of Classification Search
CPC ......... H01F 27/42; H01F 27/12; G01R 31/62; G01R 19/2513
See application file for complete search history.

(56) References Cited

U.S. PATENT DOCUMENTS

| 4,654,806 A | 3/1987 | Poyser et al. |
| 7,729,810 B2 | 6/2010 | Bell et al. |
| 8,065,022 B2 | 11/2011 | Viinto et al. |

(Continued)

FOREIGN PATENT DOCUMENTS

| CN | 103366312 A | * 10/2013 |
| WO | 2013008246 A1 | 1/2013 |

OTHER PUBLICATIONS

Cutsem et al., "Network Parameter Estimation Using Online Data With Application to Transformer Tap Position Estimation", The Institution of Electrical Engineers, http://digital-library.theiet.org/content/journals/10.1049/ip-c.1988.0004, vol. 135, Issue 01, pp. 31-40, Jan. 1988.

(Continued)

*Primary Examiner* — Jue Zhang
(74) *Attorney, Agent, or Firm* — Armstrong Teasdale LLP

(57) ABSTRACT

A method for controlling operation of transformer system includes receiving, by a controller unit, transformer data corresponding to a transformer. The transformer data includes a plurality of transformer input parameters and a plurality of transformer output parameters. The method further includes receiving, by a digital transformer unit, the plurality of transformer input parameters from the controller unit. The digital transformer unit is a real-time operational model of the transformer. The method also includes generating, by the digital transformer unit, a plurality of transformer output parameter estimates corresponding to the plurality of transformer output parameters. The method further includes controlling operation of the transformer, by the controller unit, based on at least one of the transformer data and the plurality of transformer output parameter estimates.

19 Claims, 15 Drawing Sheets

(56) References Cited

U.S. PATENT DOCUMENTS

| | | |
|---|---|---|
| 9,404,957 B2 | 8/2016 | Chen et al. |
| 2007/0055392 A1 | 3/2007 | Fernando et al. |
| 2012/0327745 A1 | 12/2012 | Tarik et al. |
| 2016/0365736 A1 | 12/2016 | Frederick et al. |
| 2017/0011612 A1* | 1/2017 | Jain ..................... H01F 27/008 |

OTHER PUBLICATIONS

Trappey et al., "Data Driven Modeling for Power Transformer Lifespan Evaluation", Journal of Systems Science and Systems Engineering, https://link.springer.com/article/10.1007/s11518-014-5227-z, vol. 23, Issue 01, pp. 80-93, Mar. 2014.

Zhang et al., "Data Driven Model for the Prediction of the Expected Lifetime of Transformers", Winter Simulation Conference, http://dl.acm.org/citation.cfm?id=2889015, pp. 3154-3155, 2015.

* cited by examiner

SYSTEM AND METHOD FOR TRANSFORMER CONTROL

BACKGROUND

Embodiments of the present specification relate generally to electromechanical systems, and more particularly to systems and methods for performance optimization, health assessment and control of electric drive train subsystem using corresponding digital equivalent model.

Industrial applications often employ electromechanical subsystems such as electric drive trains, electric power generation systems, variable frequency drives and transformer systems. Electrical drive trains having a power supply, an electrical motor, and a mechanical load, may be used in industrial plants such as steel rolling mills. Optionally, the electrical drive train may also include at least one of a variable frequency drive and a gearbox. The performance optimization and health assessment of industrial plants require optimal operation and control of the drive train.

Recently, there has been a surge in generating prognostics of electromechanical systems enabling health assessment, optimization of performance and control operation of the electromechanical systems. The operational characteristics of the electromechanical systems are generated based on advanced modelling techniques. Digital equivalents of electromechanical subsystems, often termed as 'digital twins', are used to generate one or more operational characteristics. Such digital equivalents are expected to estimate the performance and health metrics of a subsystem such as an electrical drive train.

BRIEF DESCRIPTION

In accordance with one aspect of the present specification, a method for controlling operation of transformer system is disclosed. The method includes receiving, by a controller unit, transformer data corresponding to a transformer. The transformer data includes a plurality of transformer input parameters and a plurality of transformer output parameters. The method further includes receiving, by a digital transformer unit, the plurality of transformer input parameters from the controller unit. The digital transformer unit is a real-time operational model of the transformer. The method also includes generating, by the digital transformer unit, a plurality of transformer output parameter estimates corresponding to the plurality of transformer output parameters. The method further includes controlling operation of the transformer, by the controller unit, based on at least one of the transformer data and the plurality of transformer output parameter estimates.

In accordance with another aspect of the present specification, a transformer system is disclosed. The transformer system includes a transformer configured to be coupled to a first electrical subsystem and a second electrical subsystem and configured to generate transformed electrical parameters characterized by transformer data. The transformer data includes a plurality of transformer input parameters and a plurality of transformer output parameters. The transformer system further includes a digital transformer unit configured to be coupled to the transformer. The digital transformer unit is a real-time operational model of the transformer. The digital transformer unit is configured to receive the plurality of transformer input parameters and generate transformer output parameter estimates corresponding to the plurality of transformer output parameters. The system also includes a controller unit configured to be coupled to the digital transformer unit. The controller unit is configured to control operation of the transformer based on at least one of the transformer data and the plurality of transformer output parameter estimates.

In accordance with another aspect of the present specification, a non-transitory computer readable medium encoded with instructions is disclosed. The instructions further enable at least one processor to receive, by a controller unit, transformer data corresponding to a transformer. The transformer data includes a plurality of transformer input parameters and a plurality of transformer output parameters. The instructions also enable at least one processor to receive, by a digital transformer unit, a plurality of transformer input parameters. The digital transformer unit is a real-time operational model of the transformer. The instructions further enable at least one processor to generate, by the digital transformer unit, a plurality of transformer output parameter estimates corresponding to the plurality of transformer output parameters. The instructions also enable at least one processor to control operation of the transformer, by the controller unit, based on at least one of the transformer data and the plurality of transformer output parameter estimates.

DRAWINGS

These and other features and aspects of embodiments of the present invention will become better understood when the following detailed description is read with reference to the accompanying drawings in which like characters represent like parts throughout the drawings, wherein.

DETAILED DESCRIPTION

Figure 1:
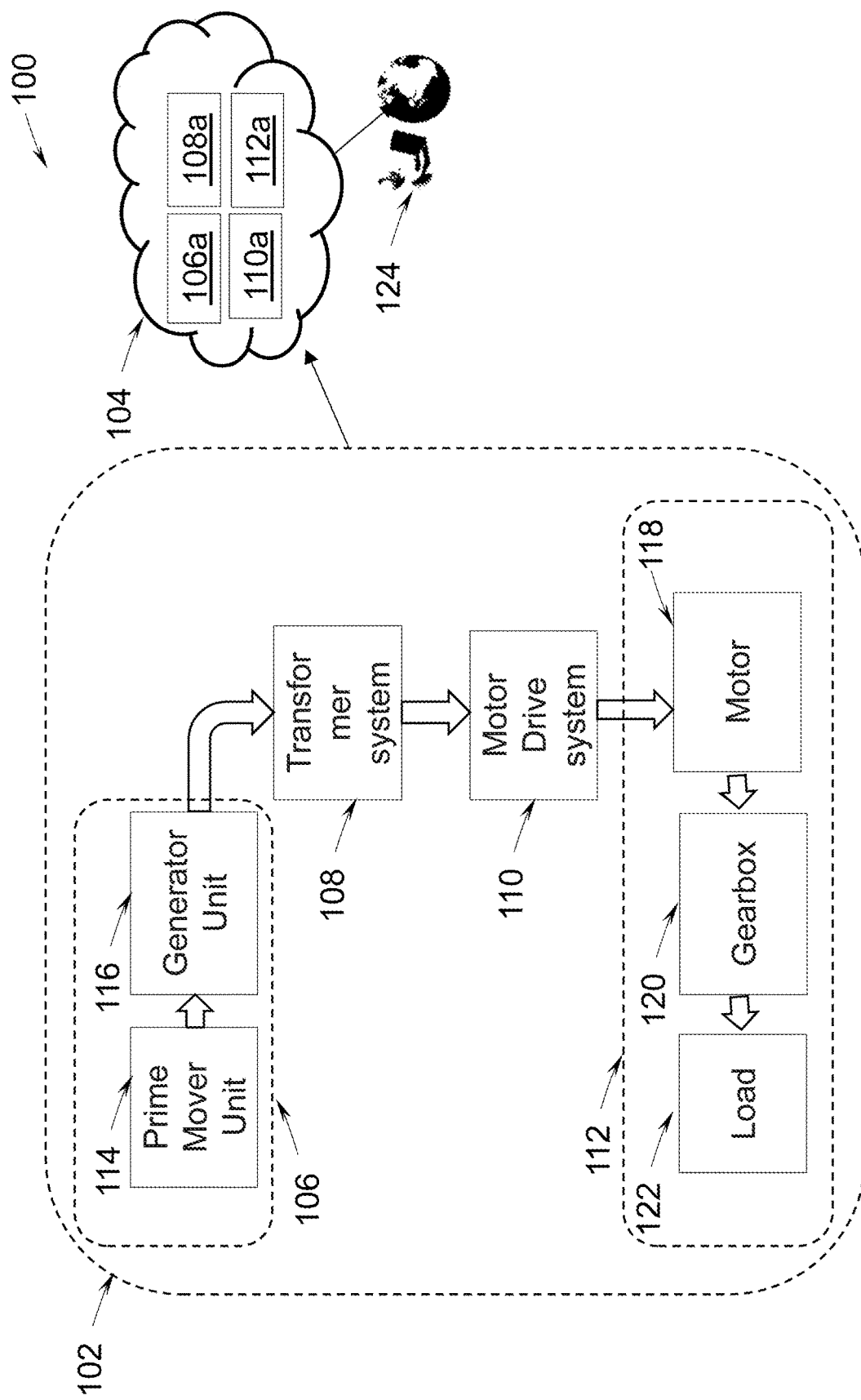
FIG. 1 is a diagram of an electromechanical system having an industrial asset and a corresponding digital twin in accordance with one aspect of the present specification.

As will be described in detail hereinafter, systems and methods for performance optimization, health assessment, and control of a mechanical transmission system using digital equivalent model are presented.

In certain embodiments, a digital twin refers to a dynamic digital representation of a physical industrial asset. It may be noted that the industrial asset may include a single asset or a plurality of assets. The term Digital Twin (DT), as used herein, is intended to refer to a digital model (i.e., executing computer code capable of modeling a particular industrial asset) of the structure, behavior and context of the physical industrial asset. The digital twin of a physical industrial asset may also be referred to as a 'digital asset', 'digital equivalent' or 'digital equivalent model'. In some embodiments, the digital twin may include a set of virtual data constructs representative of a potential or an actual physical industrial asset from a micro atomic level to a macro geometric level. A digital twin may provide data that may be obtained from, for example, inspecting a physical product. As used herein, the phrase 'Edge analytics' refers to processing of sensor data at non-central nodes, such as using on-premise servers that are capable of executing analytics without receiving data from cloud servers. It should be appreciated that various embodiments may employ both local and remote servers and that, unless indicated otherwise, descriptions of the relative execution location of the particular analytic or digital twin is not intended to be limiting.

As used herein, the phrase 'platform as a service' also referred to as 'PaaS' is a cloud computing service platform enabling customers or users to develop, run and manage applications without the complexity of building and maintaining an infrastructure associated with developing and launching an application. As used herein, the phrase 'enterprise system' refers to an application software package business processes of large scale organizations and includes enterprise resources planning (ERP) system, customer relationship management system and enterprise operation management systems. As used herein, the term 'internet of things' or 'IoT' refers to a network of a plurality of industrial assets and other physical entities embedded with one or more of electronics, software, sensors, actuators, and intelligence that enable higher industrial productivity.

In embodiments of the present specification, an industrial asset includes electromechanical machines, such as a motor and a generator, a prime mover, an electrical machine such as a frequency drive, and transformers. However, it should be appreciated that certain concepts and embodiments as described herein may also be applicable to other types of industrial assets, such as engines, turbines, or the like, and that such references to electromechanical machines are not intended to be limiting unless explicitly indicated. In some embodiments, the industrial asset may further include any hardware physical machine or a fleet deployed in an industrial installation. In certain embodiments, the industrial asset may be used to offer an industrial service.

FIG. 1 is a diagram of an electromechanical system 100 having an industrial asset 102 and a corresponding digital twin 104 in accordance with one aspect of the present specification. In the illustrated embodiment, the industrial asset 102 includes a power generation system 106, a transformer system 108, a motor drive system 110, and a mechanical transmission system 112. The power generation system 106 is coupled to the transformer system 108, the motor drive system 110 is coupled to the transformer system 108 and the mechanical transmission system 112. The power generation system 106 includes a prime mover unit 114 and a generator unit 116 coupled to one another. The mechanical transmission system 112 includes a motor 118, a gearbox 120, and a load 122. The motor 118 is coupled to the gearbox 120 and the gearbox 120 in turn is coupled to the load 122. The load 122 utilizes the mechanical energy generated by the motor and may require a constant torque or a variable torque. The systems 106, 108, 110 and 112 are physical systems and the units 114, 116, 118, 120, 122 are physical units.

The digital twin 104 is set of executing program code that serves to provide a digital representation of the industrial asset 102. The digital twin 104 may be configured to provide analytics, health prediction and performance assessment of the industrial asset 102. As described herein, the digital twin 104 may provide a digital equivalent of an industrial asset configured to analyze operation of the industrial asset. As a result of the analysis, the digital twin 104 may further include algorithms and subroutines that are capable of identifying anomalies exhibited by the industrial asset at present time instant, and predicting anomalies in the future. The digital twin 104 may further include algorithms and subroutines that are configured to determine a life duration of one or more components of the industrial asset. The digital twin 104 includes analytical models such as, but not limited to, data models, machine learning models, design models, prognostic models corresponding to the physical industrial asset. In general, the analytical models are generated based on environmental data, operational data, inspection and repair data, design data, and combinations thereof.

In particular, the digital twin 104 is further configured to provide performance assessments of individual systems 106, 108, 110, 112 of the industrial asset 102. Further, the digital twin 104 may also be configured to provide performance assessment of units 114, 116, 118, 120, 122 and components of these units. The electromechanical system 100 further includes a user interface 124 communicatively coupled to the digital twin 104 and configured to provide access to the analytical services offered by the digital twin 104.

In some embodiments, the digital twin 104 includes a digital power generation system 106a corresponding to the power generation system 106. The digital power generation system 106a includes a digital prime mover unit (not shown in FIG. 1) and a digital generator unit (not shown in FIG. 1). Further, the digital twin 104 includes a digital transformer system 108a corresponding to the transformer system 108, a digital motor drive system 110a corresponding to a motor drive system 110, and a digital drive train system 112a corresponding to the mechanical transmission unit 112. Although not illustrated, the digital drive train system 112a further includes a digital motor unit, a digital gearbox unit and a digital load unit corresponding to the motor 118, gearbox 120 and load 122, respectively. In embodiments where the power generation system 106 includes the prime mover unit 114 and the generator unit 116, the digital power generation system also includes a digital prime mover unit and a digital generator unit corresponding to the prime mover unit 114 and the generator unit 116, respectively. The systems 106a, 108a, 110a, 112a are digital systems equivalent to physical systems 106, 108, 110, 112 respectively. The digital prime mover unit and the digital generator unit within the digital system 106a are digital equivalents to the physical units 114 and 116 respectively. Similarly, the digital motor unit, the digital gearbox unit and the digital load unit are digital equivalents of the physical units 118, 120 and 122 respectively.

The digital twin 104 of the industrial asset 102 may be located in a device remotely located with respect to the industrial asset 102. Further, the digital twin 104 is communicatively coupled to the industrial asset 102. By way of example, the digital twin 104 may be configured to directly or indirectly receive data pertaining to sensors and data acquisition units coupled to the industrial asset 102.

In one embodiment, the electromechanical system 100 may include a power generation system having the physical system 106 and the digital system 106a, a transformer system having the physical system 108 and the digital system 108a, a motor drive system having the physical system 110 and the digital system 110a and a mechanical transmission system having the physical system 112 and the digital system 112a. The electromechanical system 100 is configured to operate efficiently based on the data obtained from the physical systems 106, 108, 110, 112 and digital systems 106a, 108a, 110a, 112a. Further, the electromechanical system 100 exhibits higher fault tolerance, provides quality prognostics and diagnostic indicators. In one embodiment, the physical system 106 and the corresponding digital system 106a are configured to receive the same inputs. The physical systems 108, 110 and 112 are configured to receive inputs from the physical systems 106, 108 and 110 respectively. Similarly, the digital systems 108a, 110a and 112a are configured to receive inputs from the digital systems 106a, 108a and 110a respectively. Further, the physical system 112 and the corresponding digital system 112a are configured to generate similar outputs. In some embodiments, one or more of the digital systems 106a, 108a, 110a, 112a may receive parameters from corresponding physical systems 106, 108, 110, 112 respectively at least for short periods of time to provide continuity of operation of the electromechanical system 100. One or more of the digital systems 106a, 108a, 110a, 112a may be used instead of the corresponding physical systems 106, 108, 110, 112 for performance assessment, generating prognostics, diagnosis of faults, and efficient operation of the electromechanical system 100. In embodiments disclosed herein, the output of digital systems 106a, 108a, 110a, 112a may be used to determine a control action or a recommendation required for efficient operation of the electromechanical system 100. Further, one or more of recommendations and control actions may be presented to an operator to take suitable decisions and initiate actions therefrom.

Figure 2:
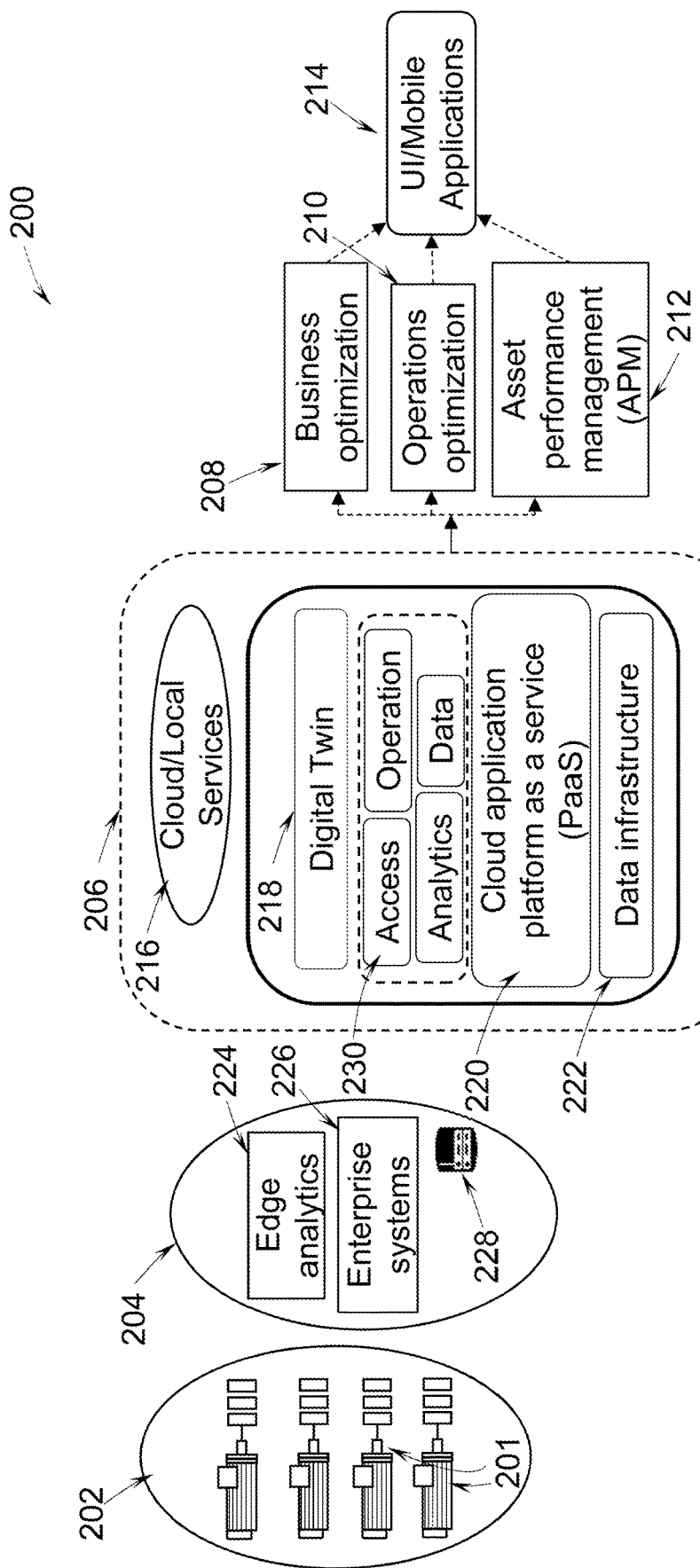
FIG. 2 is a schematic of an "Internet of Things" (IoT) architecture for employing a digital twin of an industrial asset in accordance with one aspect of the present specification.

FIG. 2 is a schematic of an IoT architecture 200 having a digital twin of an industrial asset 202 in accordance with one aspect of the present specification. The industrial asset 202 of the IoT architecture 200 is communicatively coupled to a cloud 206 via a connectivity interface 204. The industrial asset 202 in general includes a plurality of industrial systems 201 and may include a fleet of machines such as, but not limited to, prime movers, electric generators, transformer systems, variable frequency drives, drive trains, aircraft engines, turbines, locomotives, medical scanners, and combinations thereof. The connectivity interface 204 and cloud 206 of the IoT architecture 200 are configured to provide a plurality of industrial outcomes such as, but not limited to, business optimization 208 using the industrial asset 202, operational optimization 210 of the industrial asset 202, performance management 212 of individual systems 201, or combinations thereof. In one embodiment, the IoT architecture 200 may include a centralized facility to manage one or more of the industrial outcomes via a suite of user interface applications 214. In other instances, the IoT architecture 200 may enable management of one or more of the industrial outcomes via mobile devices distributed over a geographical area.

The user interface applications 214 are configured to receive inputs from an operator, access one or more hardware and software based interfaces 230 and initiate cloud services 216. The cloud services 216 are configured to utilize digital twins 218, and aPaaS 220 to realize one or more of the plurality of industrial outcomes. In one embodiment, the connectivity interface 204 includes analytics 224, enterprise systems 226, communication infrastructure 228, or combinations thereof. The enterprise system 226 is configured to process data generated by the plurality of industrial systems 201 and transmit the processed data to the cloud 206. The communication infrastructure 228 is configured to establish data transfer between the plurality of industrial systems 201 and the cloud 206.

The cloud 206 includes a distributed and large-scale storage, communication and communication facility based on existing and expanding cyber infrastructure. The cloud 206 may be deployed as a private cloud, a public cloud, or as a combination of both, on servers that may be dedicated servers. The public cloud service allows the consumer controls software deployment with minimal configuration options, and the provider provides the networks, servers, storage, operating system (OS), middleware (e.g. Java runtime, .NET runtime, integration, etc.), database and other services to host the consumer's application. The private cloud service is protected with a firewall, or deployed as software on a public infrastructure and provided through a service interface. The cloud 206 may also be in the form of a multi-cloud configured to accommodate more than one cloud providers. The cloud 206 includes data infrastructure 222 developed based on shared hardware and software resources communicatively linked via internet services. The data infrastructure 222 enables services and facilities necessary for a digital environment.

Further, the cloud 206 includes a cloud application configured as aPaaS 220 or application platform as a Service (aPaaS). In one embodiment, the aPaaS 220 is delivered as a public cloud service via the public cloud. In other embodiments, the aPaaS 220 is delivered as a private cloud service via the private cloud. In the embodiments where the aPaaS 220 is delivered as a private cloud, the aPaaS 220 provides a platform allowing customers to develop, run, and manage applications without the complexity of building and maintaining the infrastructure typically associated with developing and launching an app. The cloud 206 further includes a plurality of digital twins 218, where each of the digital twins 218 corresponds to a particular industrial system 201 of the industrial asset 202. The plurality of digital twins 218 integrated with the data infrastructure and utilized by the aPaaS 220. The cloud 206 further includes hardware and software based interfaces 230 to provide access to data and services that enable operational control of the one or more of the plurality of industrial systems 201, build and/or store digital twins, such as digital twins 218, design and/or manage analytical solutions, and manage data required for providing cloud services.

In one embodiment, a digital twin 218 of the industrial asset 202 may represent a power generation unit. Other non-limiting examples of the digital twin 218 include a digital prime mover unit corresponding to a prime mover unit, a digital electric generator unit corresponding to an electric generator, a digital transformer system corresponding to a transformer system, a digital motor drive system corresponding to a motor drive system, a digital drive train system corresponding to a drive train, a digital motor unit corresponding to an electric motor, a digital gearbox unit corresponding to a gearbox unit, a digital load unit corresponding to an electric load, a digital aircraft engine corresponding to an aircraft engine, a digital turbine unit corresponding to a turbine, a digital locomotive unit corresponding to a locomotive, and a digital medical scanner corresponding to a medical scanner. In another embodiment, the digital twin 218 may represent a sub-system such as an electric generation sub-system of a broader system. In yet another embodiment, the digital twin 218 may represent only a portion of a sub-system, such as a three-phase electric generator of an electrical generation sub-system. In one embodiment, the digital twin 218 is representative of one or more operational or utility aspects of the system, the sub-system or the portion of the sub-system. For example, the digital twin 218 may be configured to provide a lifting model of a system or a sub-system. In another example, the digital twin 218 may be configured to provide anomaly models corresponding to a structure and/or an operation of the system, the sub-system or the portion of the sub-system. The digital twin 218 may also be representative of domain or operational models.

In one embodiment, the cloud 206 provides services in the form of a Digital Twin-as-a-Service (DTaaS) model for simulation and prediction of industrial processes using the digital twins. In such a scenario, various simulations models corresponding to assets, systems and processes are provided in a cloud library hosted by the cloud 206. In one embodiment, the cloud library includes a plurality of models for each system in the digital asset 202. The cloud library further includes other components that are required to generate optimized model of the industrial asset 202 at a required time instant. The service oriented architecture of the cloud 206 may be augmented by orchestration of services by enhancing intelligence and autonomic control in the cloud architecture. Specifically, the orchestration defines the policies and service levels through automated workflows, provisioning and change management. In one embodiment, the change management is enabled by the deployment of an intelligent, large scale data management system such as Historian developed by General Electric. The data management system is configured to collect industrial data, aggregates the collected data and utilized optimally with the help of inherent intelligence and computational capability of the cloud. The cloud services are configured to leverage newer events occurring during operation of the industrial asset 202 and corresponding optimal control actions to improvise the performance of orchestration of services or to modify the machine learning techniques.

Figure 3:
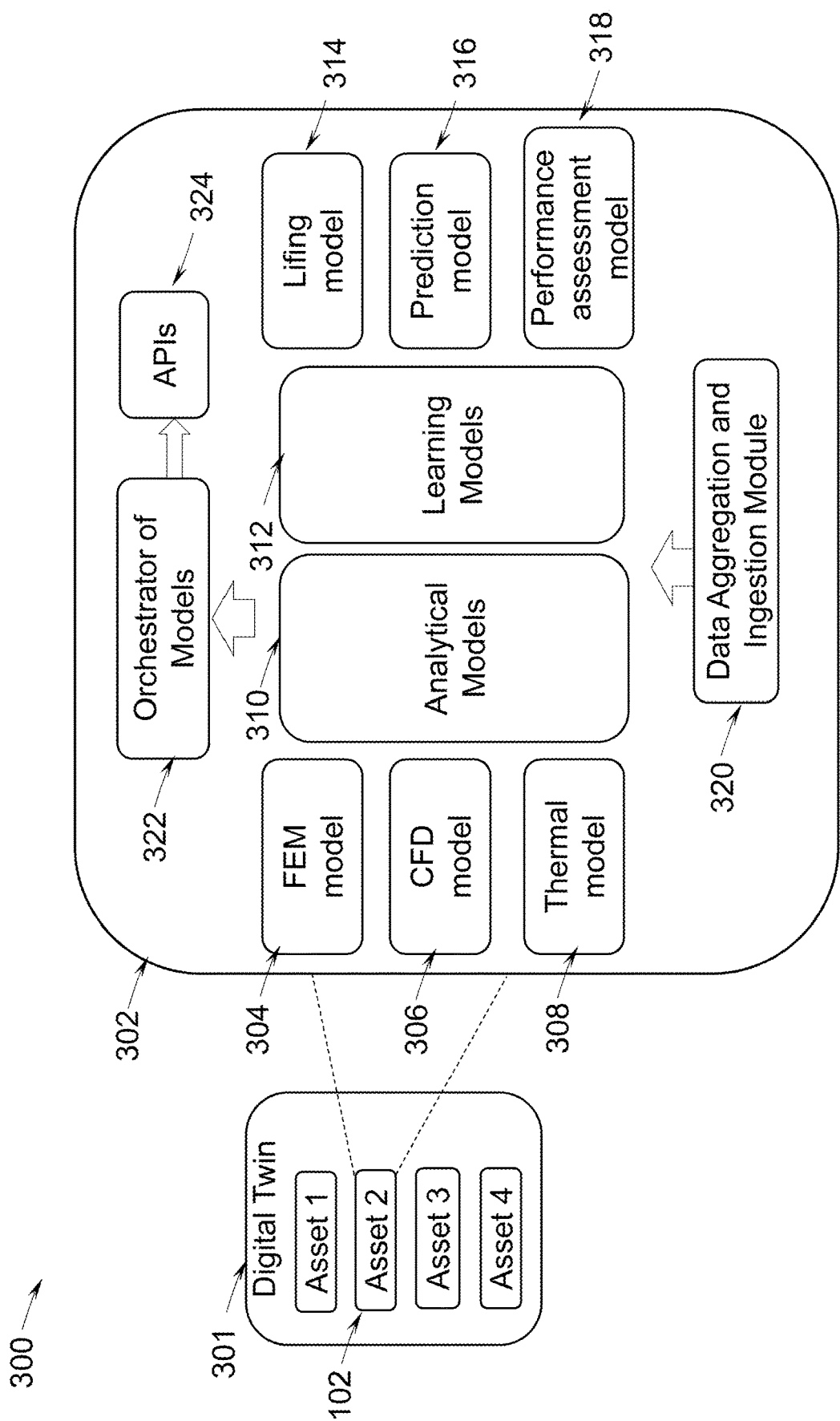
FIG. 3 is a schematic of an architecture for employing a digital twin of an industrial asset in accordance with aspects of the present specification.

FIG. 3 illustrates an architecture 300 of a digital asset or digital twin 301 corresponding to an industrial asset (not shown in FIG. 3) in accordance with aspects of the present specification. As described herein, the digital twin 301 includes executing computer code that provides for instantiation of one or more underlying models that are bound to a particular physical asset or group of assets. Various functions of the digital twin 301 may be provided by certain included algorithms, functions, and libraries executed by a computer processor, including code for instantiating the models, binding the models to a particular asset and attendant sensor data feeds from the asset so that the models receive the data feeds from the physical assets, executing the algorithms against the input data, storing the output of the models, and identifying relevant events and outcomes identified by the models. The architecture 300 corresponds to a single digital asset 301. By way of example, the digital asset 301 may include a single digital asset 218 of the plurality of digital assets 218 of FIG. 2. The architecture 300 includes a generalized model 302 having a data aggregation and ingestion module 320. As the name suggests, the data aggregation and ingestion module 320 is configured to acquire environmental data, design data, operational data, inspection and repair data. In one example, the data aggregation and ingestion module 320 is communicatively coupled to the data infrastructure 222 of FIG. 2 and configured to receive data required by the digital asset from the corresponding industrial asset. The generalized model 302 further includes a plurality of models corresponding to the digital asset 301, where the plurality of models is representative of structural, operational and analytical aspects. In one embodiment, the plurality of models in the architecture 300 includes one or more of a finite element method (FEM) model 304, a computational fluid dynamics (CFD) model 306, a thermal model 308, a lifting model 314, a prediction model 316, a performance assessment model 318, analytical models 310 and learning models 312. The plurality of models corresponds to the digital asset 301 or parts thereof. The FEM model 304 is representative of aggregation of simple models of finite elements of a complex structure/system. The FEM model may be generated using standard packages such as, but not limited to, the finite element software developed by ANSYS company. The CFD model 306 is a numerical model representative of fluid flow dynamics and associated heat and mass transfer processes. The thermal model 308 is representative of static and dynamic thermal characteristics associated with the digital asset 202. The plurality of models may also include a structural model, or any other physics based model representative of one or more aspects of the subsystem represented by the digital asset 301. In a further embodiment, the generalized model 302 includes a plurality of analytical models 310 to derive useful data based on the physics based models. The generalized model 302 may also include one or more learning models 312 derived from, machine learning models, deep learning models, and artificial intelligence (AI) based models. In some embodiments these learning models further provide self-updating capabilities using machine learning techniques based on analysis of one or more aspects of the subsystem or components of the subsystem. The lifting model 314 may provide an indication of the remaining useful life (RUL) of an associated asset or parts thereof. The prediction model 316 is configured to estimate operational dynamics of the physical asset at a future time instant. Specifically, in one embodiment, one or more models of the generalized model 302 are used in the lifting model 314 and the prediction model 316. In yet another embodiment, one or more models of the architecture 300 is used to determine a performance assessment model 318. The performance assessment model 318 is configured to estimate an assessment of operational status of the physical asset at present and future time instants. It may be noted that the architecture 300 of the industrial asset is modified to account for usage, external environments and other factors unique to the corresponding industrial asset. The architecture of the physical asset is maintained to establish equivalence with the industrial asset throughout the life cycle of the industrial asset. In embodiments disclosed herein each industrial asset and corresponding digital equivalent may be represented by the same serial number.

The generalized model 302 further includes an orchestrator of models 322 configured to access one or more of the plurality of models and generate a digital equivalent of the industrial asset. The plurality of models of a physical asset may be reused and/or modified and combined suitably to generate corresponding digital asset. The orchestrator of models 322 is also configured to update the digital equivalent by adapting one or more of the plurality of models. The architecture 300 also provides a plurality of application programming interfaces (APIs) 324 which may be used by a user interface, such as the user interface 214 of FIG. 2. The plurality of APIs 324 may be used by the orchestrator of models 322 or by an operator to effectively utilize the plurality of models of the generalized model 302.

Figure 4:
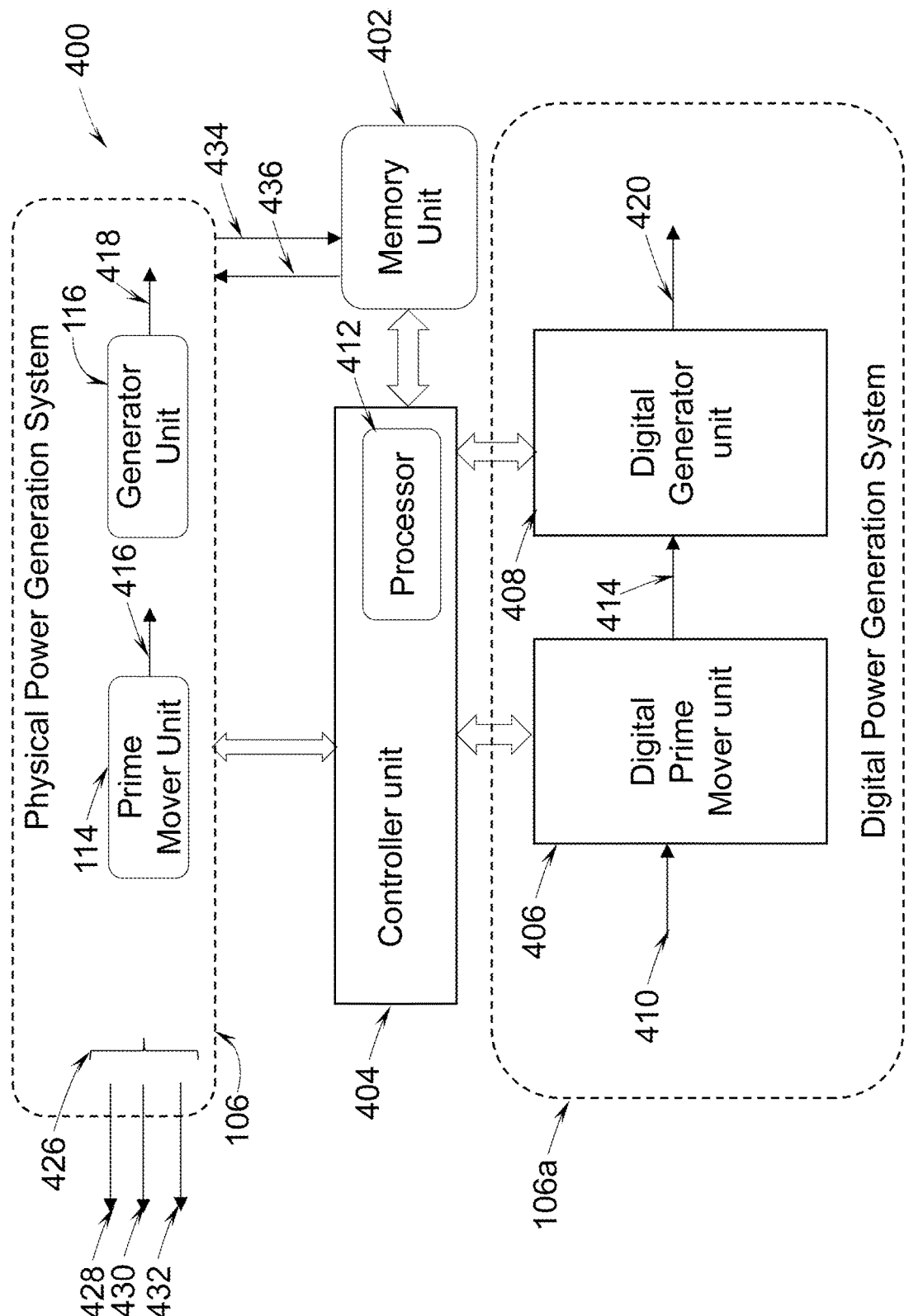
FIG. 4 is a block diagram of a power generation system in accordance with aspects of the present specification.

FIG. 4 is a block diagram of the power generation system 400 in accordance with one aspect of the present specification. The power generation system 400 includes the physical power generation system 106 and the digital power generation system 106a. The physical power generation system 106 includes a prime mover unit, such as the prime mover unit 114 of FIG. 1, and a generator unit, such as the generator unit 116 of FIG. 1, coupled to the prime mover unit 114. In one embodiment, the power generation system 400 is configured to generate the power at required voltage and current values. The physical power generation system 106 is characterized by the power generator data generated by the physical power generation system 106. The power generator data is generated during operation of the physical power generation system 106. The power generator data includes prime mover input data and the generator output data. The prime mover input data is representative of settings of prime mover and other parameters required for operation of the prime mover unit 114. The generator output data is representative of output parameters generated by the generator unit 116. The power generator data includes a plurality of prime mover parameters 416 corresponding to the prime mover unit 114, and a plurality of generator parameters 418 corresponding to the generator unit 116. The plurality of prime mover parameters 416 is representative of prime mover input data and output data of the prime mover unit 114. The plurality of generator parameters 418 includes input data and output data corresponding to the generator unit 116. The physical power generation system 106 is configured to receive a set point parameter 410 representative of settings of prime mover and generate generator output data. The power generation system 400 further includes a digital prime mover unit 406 configured to receive the set point parameter 410 corresponding to the prime mover unit 114 and generate one or more prime mover parameter estimates 414. The digital prime mover unit 406 is a real-time operational model of the prime mover unit 114. The power generation system 400 also includes a digital generator unit 408 communicatively coupled to the digital prime mover unit 406 and configured to determine one or more generator parameter estimates 420. The prime mover parameter estimates 414 are representative of estimates of corresponding prime mover parameters 416 and the generator parameter estimates 420 are representative of estimates of corresponding generator parameters 418. The digital generator unit 408 is a real-time operational model of the generator unit 116. The power generation system 400 also includes a controller unit 404 communicatively coupled to the digital prime mover unit 406 and the digital generator unit 408 and configured to control the operation of the power generation system 400 based on at least one or more of the power generation data 426, the prime mover parameter estimates 414 and the generator parameter estimates 420. The controller unit 404 is also configured to generate the digital prime mover unit 406 and the digital generator unit 408 based on the prime mover parameters 416 and the plurality of generator parameters 418. The power generation system 400 also includes a memory unit 402 configured to be accessed by a processor 412 disposed within the controller unit 404. The at least one of the digital prime mover unit 406 and the digital generator unit 408 is provided by a cloud service.

The processor 412 includes at least one of a general-purpose computer, a graphical processor unit (GPU), a digital signal processor, and a micro-controller. In other embodiments, the processor 412 includes a customized processor element such as, but not limited to, an application-specific integrated circuit (ASIC) and a field-programmable gate array (FPGA). The processor 412 may be further configured to receive commands and/or parameters from an operator via a console that has a keyboard or a mouse or any other input device for interacting with the physical power generation system 106 and the digital power generation system 400a. The processor 412 may include more than one processor co-operatively working with each other for performing intended functionalities. The processor 412 is further configured to store (retrieve) contents into (from) the memory unit 402.

In one embodiment, the memory unit 402 is a random-access memory (RAM), read only memory (ROM), flash memory, or any other type of computer readable memory accessible by at least one of the controller unit 404, the digital power generation system 106a, and the physical power generation system 106. Also, in certain embodiments, the memory unit 402 may be a non-transitory computer readable medium encoded with instructions to enable the processor 412 to control the operation of the physical power generation system 106.

In one embodiment, the power generator data 426 further includes environmental data 428, design data 430, operational data 434, historical data 436 and inspection data 432. The one or more of the prime mover parameters include parameters from prime mover nameplate information and the setpoint parameter 410, the one or more generator parameters include at least one of a current total harmonic distortion (THD) value, a current root mean square (RMS) value, voltage THD, energy usage of the physical power generation system 106. The power generator data also includes at least one of the THD value corresponding to a current parameter, a RMS value of a voltage parameter, a speed parameter corresponding to generator shaft, a frequency value corresponding to a current parameter and a voltage parameter.

In one embodiment, the controller unit 404 is configured to estimate performance of at least one of the prime mover unit 114 and the generator unit 116, based on the power generator data 426. The controller unit 404 is also configured to determine presence or absence of a fault, classify the fault, assess severity of the fault in a power generation system, and classify the fault corresponding to the physical power generation system 106. Non-limiting examples of the fault in the power generation system include a stator insulation fault, bearing defects, eccentricity, field winding insulation faults, prime mover faults, turbine blade defects, bearing defects, diesel engine misfiring, valve misposition, overheating, and excessive vibrations. Further, the controller unit 404 is configured to regulate the operation of at least one of the prime mover unit 114 and the generator unit 116 based on a type of the power generation system fault and/or severity of the power generation system fault. The controller unit 404 is also configured to assess health condition of at least one of the prime mover unit 114 and the generator unit 116 based on the power generator data, assessed performance or one or more system faults.

In another embodiment, the controller unit 404 is configured to identify a replacement condition corresponding to at least one of the prime mover unit 114 and the generator unit 116 based on assessed health condition. Further, the controller unit 404 is configured to generate a recommendation for selecting an alternate prime mover unit and/or an alternative generator unit based on the replacement condition.

In one embodiment, the controller unit 404 is configured to generate the digital prime mover unit 406 and the digital generator unit 408 based on the historical data 436, the design data 430 and the inspection data 432 using a machine learning technique. During the operation, the controller unit 404 is further configured to modify at least one of the digital prime mover unit 406 and the digital generator unit 408 based on the power generator data 426 using one or more adaptive learning techniques.

Figure 5:
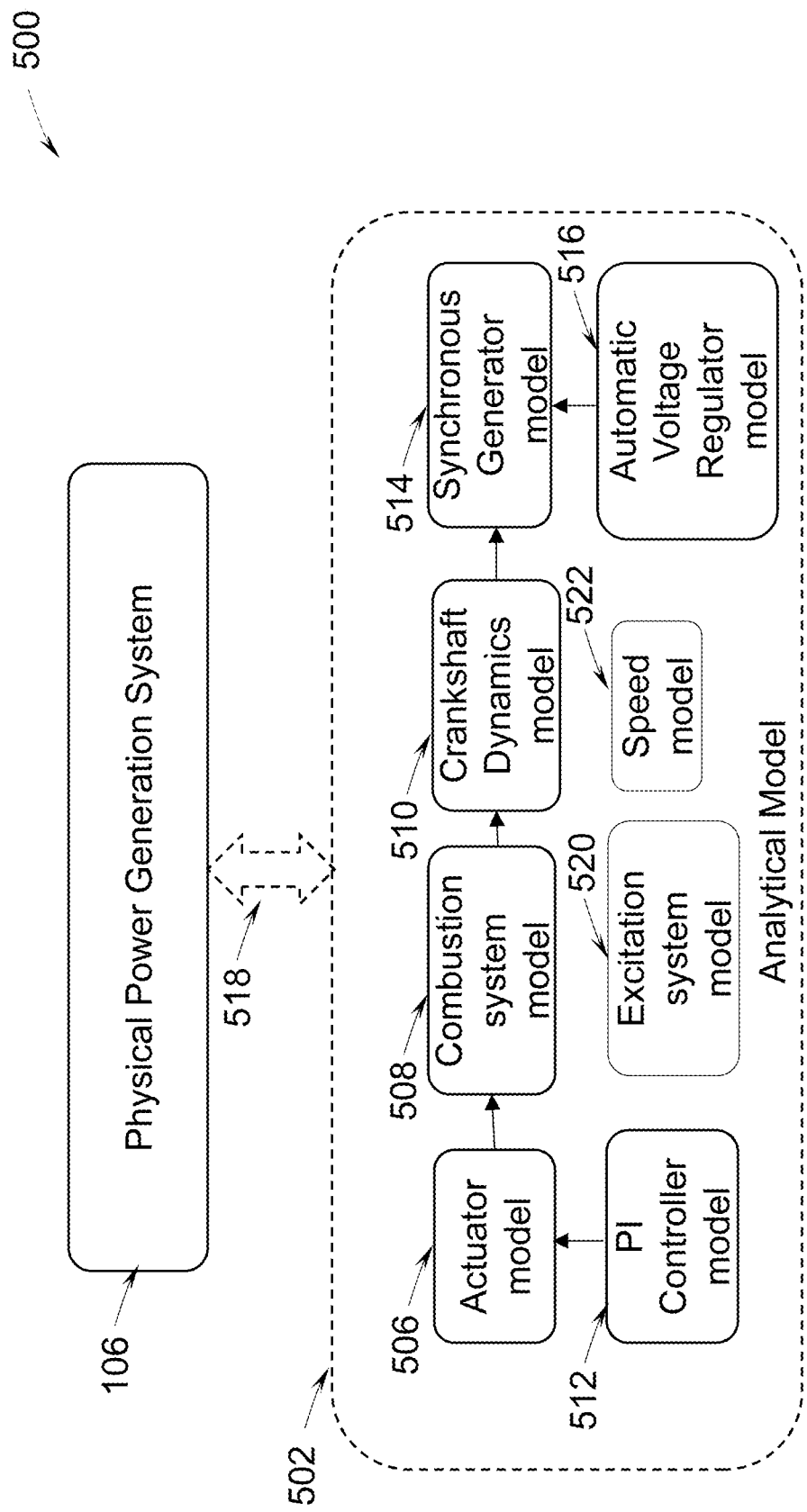
FIG. 5 is an architecture of the digital power generation system of FIG. 4 in accordance with aspects of the present specification.

FIG. 5 illustrates an architecture 500 of the digital power generation system 106a of FIG. 4 in accordance with aspects of the present specification. The architecture 500 includes power generator analytical model 502 as an example of block 310 in the generalized model of FIG. 3. The architecture 500 schematically illustrates communication of the analytical model 502 with the physical power generation system 106 by a two-way arrow 518. In the illustrated embodiment, the analytical model 502 includes an actuator model 506 representative of physical actuator system configured to initiate operation of the prime mover unit 114. The analytical model 502 further includes a combustion system model 508 communicatively coupled to the actuator model 506 and configured to represent combustion system of the prime mover unit 114. A crank shaft dynamics model 510 is communicatively coupled to the combustion system model 508 and configured to model crank shaft dynamics. The analytic model 502 also includes a proportional-integral (PI) controller model 512 communicatively coupled to the actuator model 506 and configured to regulate the crank shaft speed. In one embodiment, the actuator model, the crank shaft dynamics model and the PI controller model are represented as first order transfer functions having predefined time constants. The models 506, 508, 510, 512 represent a prime mover model. Further, the prime mover model is communicatively coupled to a synchronous generator model 514 which is further coupled to an automatic voltage regulator model 516. The synchronous generator model 514 is based on a hybrid state space model representative of flux and voltages. The automatic voltage regulator model 516 is configured to stabilize the generated voltage for various load conditions. The automatic voltage regulator model 516 is based on a state space model. The analytic model 502 further includes other models such as, but not limited to, an excitation model 520 and a speed model 522 to characterize the digital power generation system 400a as an equivalent of the physical power generation system 106.

Figure 6:
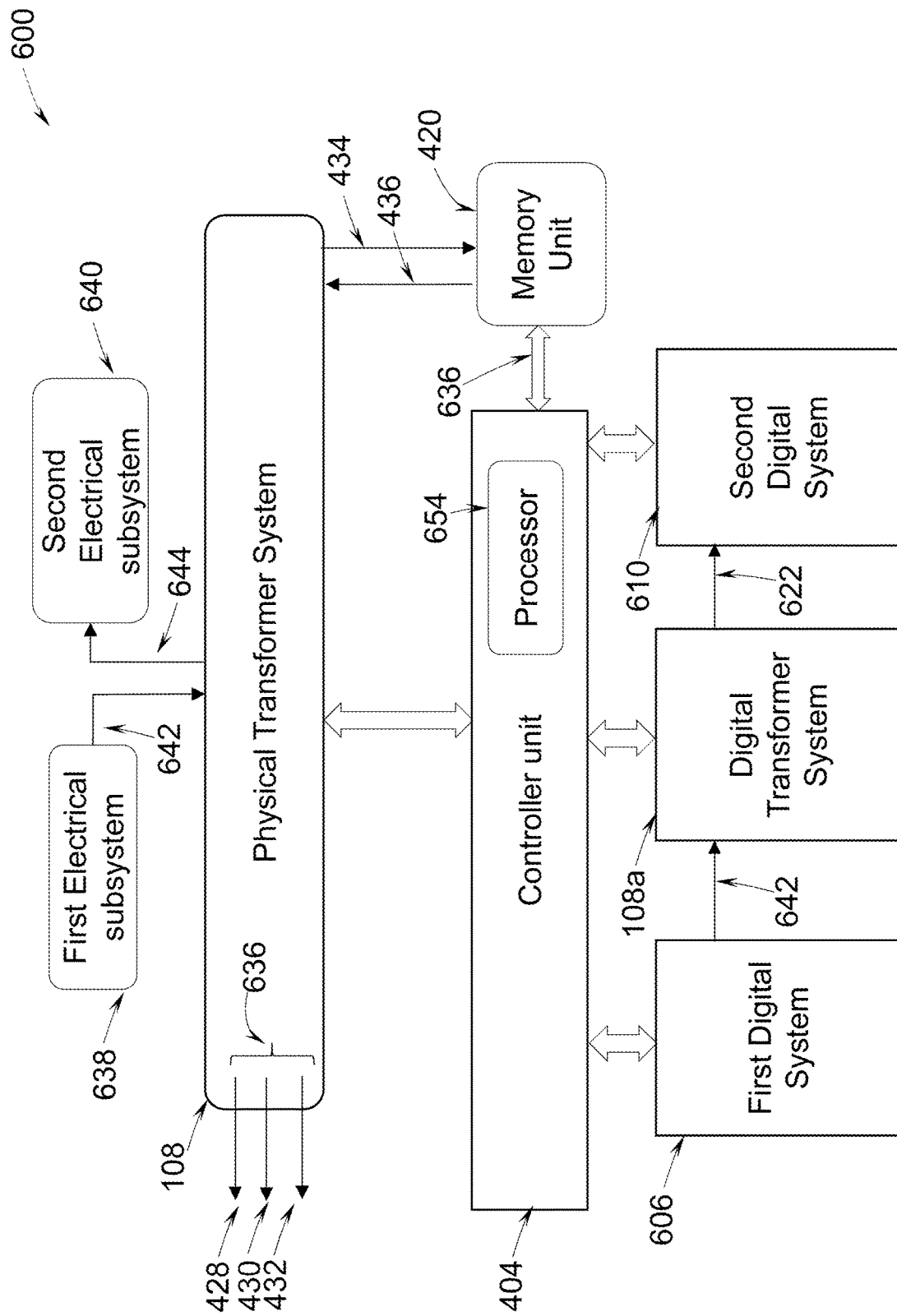
FIG. 6 is a block diagram illustrating a transformer system in accordance with aspects of the present specification.

FIG. 6 is a block diagram of a transformer system 600 in accordance with one aspect of the present specification. The transformer system 600 includes a physical transformer system 108 communicatively coupled to a first electrical subsystem 638 and a second electrical subsystem 640. The physical transformer system 108 is configured to generate transformed electrical parameters characterized by transformer data 636. The transformer data 636 includes a plurality of transformer input parameters 642 and a plurality of transformer output parameters 644. The physical transformer system 108 is configured to receive the plurality of transformer input parameters 642 from the first electrical subsystem 638. In one example, the plurality of transformer input parameters includes a first line voltage, a first line current. Further, the physical transformer system 108 may generate the plurality of transformer output parameters 644 based on the transformer input parameters 642. In one example, the plurality of transformer output parameters 644 includes a second line voltage, a second line current. Also, the physical transformer system 108 may provide these transformer output parameters 644 to the second electrical subsystem 640.

In addition to the physical transformer system 108, the transformer system 600 includes a controller unit 404 and a digital transformer system 108a. In the embodiment of FIG. 6, the digital transformer system 108a is communicatively coupled to the physical transformer system 108 via the controller unit 404. In one embodiment, the digital transformer system 108a and the controller unit 404 may communicate with the physical transformer system 108 via a cloud service. For example, a first signal corresponding to the transformer input parameters 642 is transmitted from the physical transformer system 108 to the controller unit 404 via the cloud service. Similarly, a second signal corresponding to a plurality of transformer input parameter estimates is transmitted from the controller unit 404 to the physical transformer system 108 via the cloud service.

Further, the digital transformer system 108a is a real-time operational model of the physical transformer system 108. Also, the digital transformer system 108a is configured to receive the transformer input parameters 642 from the controller unit 404. In particular, the controller unit 404 receives transformer data 636 from an internal memory of the physical transformer system 108 or from a memory unit 402 that is coupled to the controller unit 404. The transformer data 636 may include the transformer input parameters 642, the transformer output parameters 644, environmental data 428, design data 430, operational data 434, historical data 436 and inspection data 432, data from name plate information, a temperature, a leakage current, a partial discharge (PD), an energy usage, a current total harmonic distortion (THD), and a voltage total harmonic distortion (THD) related to the physical transformer system 108. Further, the controller unit 404 transmits the transformer data 636 to the digital transformer system 108a. Thereafter, the digital transformer system 108a is configured to generate transformer output parameter estimates 622 corresponding to the plurality of transformer output parameters 644, based on the transformer data 636. In one example, the digital transformer system 108a may employ machine learning techniques to generate the transformer output parameter estimates 622.

Upon generating the transformer output parameter estimates 622, the digital transformer system 108a may provide these transformer output parameter estimates 622 to the controller unit 404. Further, the controller unit 404 may control the operation of the physical transformer system 108 based on the transformer data 636, the plurality of transformer output parameter estimates 622, or a combination thereof. In one embodiment, the controller unit 404 may determine a transformer fault based on the transformer output parameter estimates 622. For example, the transformer fault may be insulation degradation or over-heating of transformer windings. Further, the controller unit 404 may control the operation of the physical transformer system 108 to control the insulation degradation or over-heating of the transformer windings. Also, the controller unit 404 may determine a remaining life duration of a component, such as the windings, or time available for a maintenance schedule based on a type of the transformer fault or severity of the transformer fault.

In another embodiment, the controller unit 404 may control the operation of the physical transformer system 108 by assessing the health of the physical transformer system 108 based on the transformer input parameters 642 and the transformer output parameter estimates 622. Also, the controller unit 404 may operate the physical transformer system 108 based on the health assessment. Specifically, the controller unit 404 is configured to modify one or more parameters of the transformer data. In yet another embodiment, the controller unit 404 may control the operation of the physical transformer system 108 by selecting a replacement transformer for replacement based on the transformer input parameters 642, the transformer output parameter estimates 622, and historical transformer data using the machine learning technique. More specifically, the controller unit 404 is configured to generate a recommendation to select a replacement transformer having a specified rating. Further, the controller unit 404 is further configured to set the tap position or set the relay of the transformer based on the specified rating.

Furthermore, the controller unit 404 may regulate operation of the first electrical subsystem 638 that provides the transformer input parameters 642 to the controller unit 404. Also, the controller unit 404 may regulate operation of the second electrical subsystem 640 that receives the transformer output parameters 644 from the physical transformer system 108. Moreover, the controller unit 404 may optimize the operation of the physical transformer system 108 based on the transformer input parameters 642 and the transformer output parameter estimates 622. In particular, the controller unit 404 may optimize the operation of the physical transformer system 108 by controlling at least one of an insulation degradation, an over-heating, a tap position, an oil quality, and an oil level in the physical transformer system 108.

In one embodiment, the digital transformer system 108*a* may be coupled to a first digital system 606 on an input side and a second digital system 610 on output side. The first digital system 606 may be a real-time operational model of the first electrical subsystem 638. Similarly, the second digital system 610 may be a real-time operational model of the second electrical subsystem 640. Also, the digital transformer system 108*a* may receive the transformer input parameters 642 from the first digital system 606. Further, the digital transformer system 108*a* may generate the transformer output parameter estimates 622 based on the transformer input parameters 642 received from the first digital system 606 and the transformer data 636 received from the controller unit 404. Thereafter, the digital transformer system 108*a* may provide the generated transformer output parameter estimates 622 to the second digital system 610 and the controller unit 404.

In one embodiment, a non-transitory computer readable medium encoded with instructions to enable at least one processor 654 is disclosed. The instructions enable the at least one processor 654 to receive the transformer data 636 corresponding to the physical transformer system 108. The instructions further enable the at least one processor 654 to control the digital transformer system 108*a* to receive the plurality of transformer input parameters 642. Further, the instructions enable the at least one processor 654 to control the digital transformer system 108*a* to generate the transformer output parameter estimates 622 corresponding to the plurality of transformer output parameters 644. The instructions also enable the at least one processor 654 to control operation of the physical transformer system 108 based on the transformer data 636 and/or the transformer output parameter estimates 622.

Figure 7:
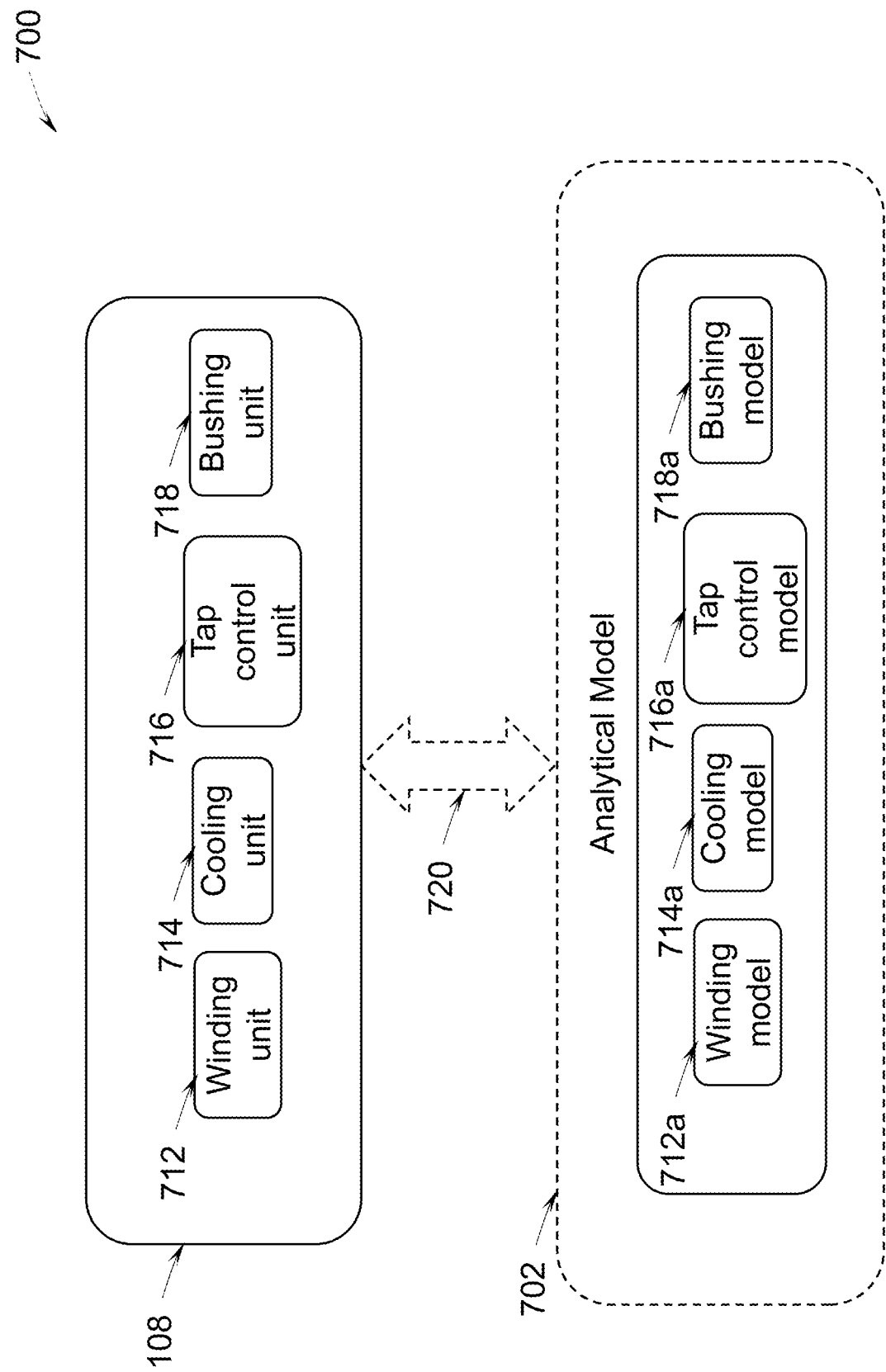
FIG. 7 is an architecture of a digital transformer system corresponding to the transformer system of FIG. 6 in accordance with aspects of the present specification.

FIG. 7 illustrates an architecture 700 of the digital transformer system 108*a* of FIG. 6 in accordance with aspects of the present specification. The architecture 700 provides architectural details of the analytical model 702 as an example of the analytical model 310 in the general architecture of FIG. 3. The architecture symbolically illustrates communication of the analytical model 702 with the physical transformer system 108 by a double arrow 720. In one embodiment, the physical transformer system 108 includes a winding unit 712, a cooling unit 714, a tap control unit 716, and a bushing unit 718. The winding unit 712 includes primary windings, second windings, one or more magnetic cores. The winding unit 712 is used to step-up or step-down a voltage from an input side to an output side of the physical transformer system 108. The cooling unit 714 may be used to reduce temperature of primary and secondary windings in the winding unit 712. Further, the tap control unit 716 may be used to regulate the voltage provided by the physical transformer system 108. The bushing unit 718 may be used to provide physical or mechanical support to the winding unit 712, the cooling unit 714, and the tap control unit 716.

Further, the analytical model 702 is part of the digital transformer system 108*a*. The analytical model 702 is used to generate a plurality of transformer output parameter estimates 622 corresponding to a plurality of transformer output parameters 644. In the embodiment of FIG. 7, the analytical model 702 includes a winding model 712*a*, a cooling model 714*a*, a tap control model 716*a*, and a bushing model 718*a*. It may be noted that the analytic model 702 may include other models, and is not limited to the models shown in FIG. 7. Also, the analytic model 702 may use these models 712*a*-718*a* to characterize the digital transformer system 108*a* as an equivalent of the physical transformer system 108. The winding model 712*a* is a real-time operational model of the winding unit 712. Also, the winding model 712*a* may generate the transformer output parameter estimates 622 related to the leakage current in the windings and insulation degradation of the windings. Further, the cooling model 714*a* is a real-time operational model of the cooling unit 714. Also, the cooling model 714*a* may generate the transformer output parameter estimates 622 related to a winding temperature and an oil temperature in the physical transformer system 108. Furthermore, the tap control model 716*a* is a real-time operational model of the tap control unit 716. The tap control unit 716 may generate the transformer output parameter estimates 622 related to a regulated voltage of the physical transformer system 108. In addition, the bushing model 718*a* is a real-time operational model of the bushing unit 718. The bushing model 718*a* may generate the transformer output parameter estimates 622 related to strength of the bushing unit 718.

Figure 8:
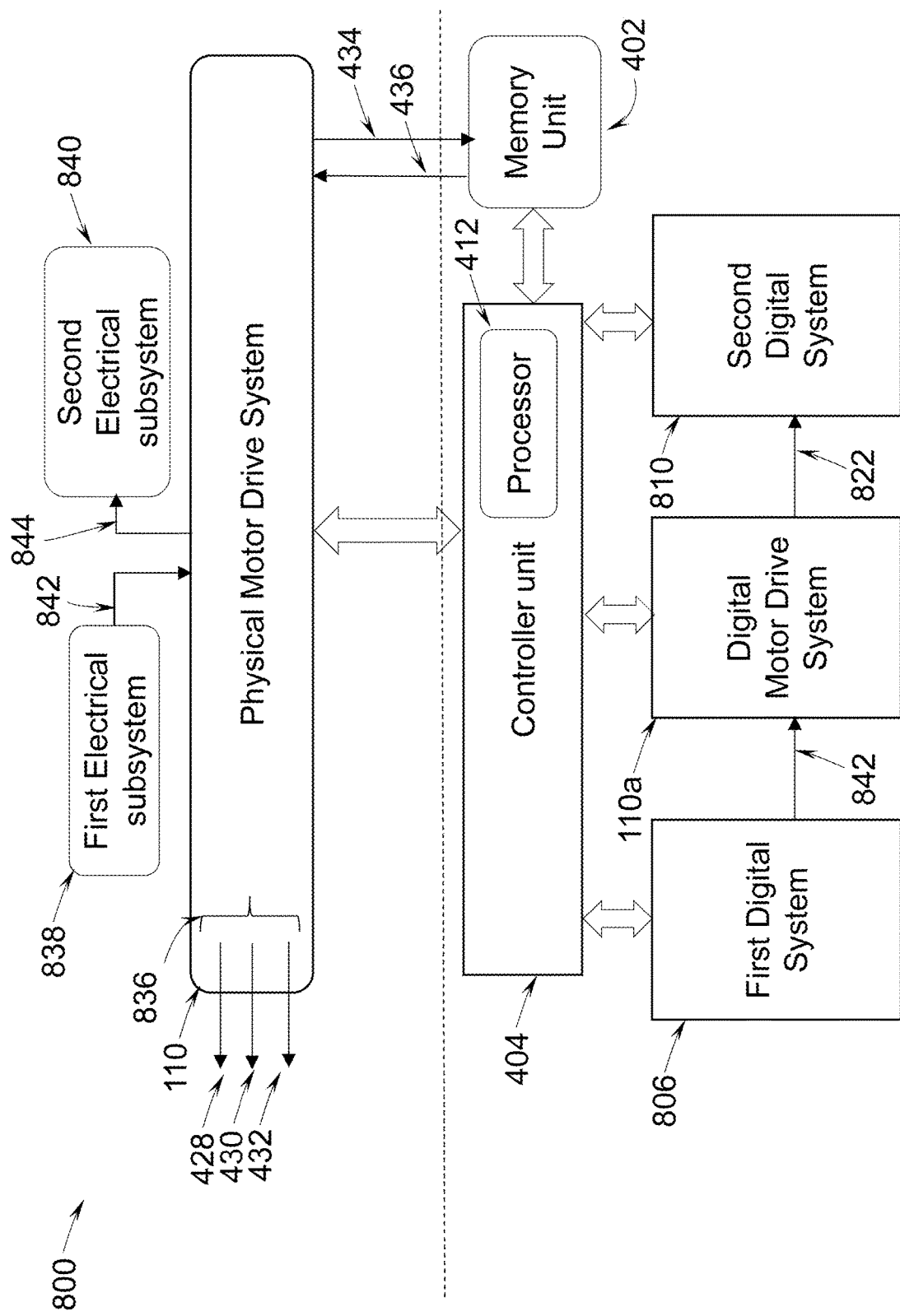
FIG. 8 is a block diagram illustrating a motor drive system in accordance with aspects of the present specification.

FIG. 8 is a block diagram of the motor drive system 800 in accordance with one aspect of the present specification. The motor drive system 800 includes the physical motor drive system 110 of FIG. 1 communicatively coupled to a first electrical subsystem 838 and a second electrical subsystem 840. In this embodiment, the physical motor drive system 110 is a variable frequency drive unit. The data corresponding to the motor drive system 800 is referred herein as motor drive data 844. The motor drive system 800 is configured to receive a plurality of frequency drive input parameters generally represented by arrow 842 and generate frequency drive output parameters generally represented by arrow 844. The motor drive data 836 includes the plurality of frequency drive input parameters 842 and the plurality of frequency drive output parameters 844. The plurality of frequency drive input parameters 842 is representative of input data received by the frequency drive and the plurality of frequency drive output parameters 844 is representative of output data generated by the frequency drive. The motor drive system 800 further includes a digital motor drive system 110a communicatively coupled to the physical motor drive system 110. The digital motor drive system 110a is a digital equivalent of the variable frequency drive unit. The digital motor drive system 110a is a real-time operational model of a physical motor drive system 110, and configured to receive the plurality of frequency drive input parameters. The digital motor drive system 110a is further configured to generate frequency drive output parameter estimates 822 corresponding to the plurality of frequency drive output parameters 844. The frequency drive system further includes the controller unit 404 communicatively coupled to the digital motor drive system 110a. The controller unit 404 is configured to control the operation of the physical motor drive system 110 based on the one or more of the motor drive data 836, and the frequency drive output parameter estimates 822 generated by the digital motor drive system 110a. In one embodiment, the digital motor drive system 110a is provided by a cloud service.

In one embodiment, the motor drive data 844 further includes environmental data 428, design data 430, and inspection data 432. The motor drive data 836 also includes operational data 434 and the historical data 436. It may be noted that environmental data corresponding to the motor drive system 800, design data corresponding to the motor drive system 800, inspection data corresponding to the motor drive system 800, operational data corresponding to the motor drive system 800 are considered in the motor drive data 836.

In one embodiment, the plurality of frequency drive input parameters 842 includes one or more of a first line voltage, a first line current, a first frequency value and the plurality of frequency drive output parameters 844 includes a second line voltage, a second line voltage, a second frequency value, a current total harmonic distortion (THD), a current root mean square (RMS) value, a voltage (RMS) value, a drive frequency value. The controller unit 404 is configured to derive health assessment of the motor drive system 800 based on the frequency drive input parameters 842 and the frequency drive output parameter estimates 822.

In one embodiment, the controller unit 404 is configured to operate the motor drive system 800 based on the derived health assessment. Specifically, the controller unit 404 is configured to determine a motor drive fault such as, but not limited to, a power switch failure, an insulated-gate bipolar transistor (IGBT) fault, a drive control fault, a drive insulation fault, an overheating failure, a direct current (DC) bus failure, and a capacitor failure. The controller unit 404 is configured to determine at least one of a remaining life duration of a component or time available for a maintenance schedule based on a type of the motor drive fault or severity of motor drive fault.

In one embodiment, the controller unit 404 is configured to select a variable frequency drive for replacement based on the frequency drive input parameters 842, the frequency drive output parameter estimates 822 and historical frequency drive data using machine learning technique. In another embodiment, the controller unit 404 is configured to generate a recommendation to replace the variable frequency drive unit based on the type of the motor drive fault and severity of the motor drive fault. Specifically, the controller unit is configured to generate a recommendation to select between one of an IGBT based frequency drive and a metal-oxide-semiconductor field-effect transistor (MOSFET) based frequency drive.

In one embodiment, the plurality of frequency drive input parameters 842 includes one or more of a first line voltage, a first line current, a first frequency value and the plurality of frequency drive output parameters 844 includes a second line voltage, a second line voltage, a second frequency value. Further, the plurality of frequency drive input parameters 842 further includes operational parameters and environmental parameters and the plurality of frequency drive output parameters 844 further includes at least one of a current total harmonic distortion (THD), a current root mean square (RMS) value, a voltage (RMS) value, a drive frequency value.

In one embodiment, the controller unit 404 is configured to operate the variable frequency drive based on the derived health assessment. In another embodiment, the controller unit 404 is configured to modify the physical motor drive unit 110 during operation based on the motor drive data 836. During operation, the controller unit 404 is configured to regulate operation of at least one of the first electrical subsystem 838 configured to provide the frequency drive input parameters 842, the second electrical subsystem 840 configured to provide the frequency drive output parameters 844 and the physical motor drive system 110.

In one embodiment, the digital motor drive system 110a may be coupled to a first digital system 806 on an input side and a second digital system 810 on output side. The first digital system 806 may be a real-time operational model of the first electrical subsystem 838. Similarly, the second digital system 810 may be a real-time operational model of the second electrical subsystem 840. Also, the digital motor drive system 110a may receive the frequency drive input parameters 842. Further, the digital motor drive system 110a may generate the frequency drive output parameter estimates 822 based on the frequency drive input parameters 842 and the motor drive data 836 received from the controller unit 404. Thereafter, the digital motor drive system 110a may provide the generated frequency drive output parameter estimates 822 to the second digital system 810 and the controller unit 404.

In one embodiment, a non-transitory computer readable medium encoded with instructions to enable at least one processor is disclosed. The instructions enable the at least one processor to receive motor drive data corresponding to the motor drive system. In one embodiment, the motor drive system includes a variable frequency drive. The motor drive data includes a plurality of frequency drive input parameters and a plurality of frequency drive output parameters. Further, the instructions enable the at least one processor to determine a digital variable frequency drive unit based on the motor drive data. The digital variable frequency drive unit is a real-time operational model of the variable frequency drive. Further, the instructions enable the at least one processor to control the digital variable frequency drive unit to generate frequency drive output parameter estimates corresponding to the plurality of frequency drive output parameters. The instructions also enable the at least one processor to control operation of the variable frequency drive based on the one or more of the motor drive data, and the frequency drive output parameter estimates.

Figure 9:
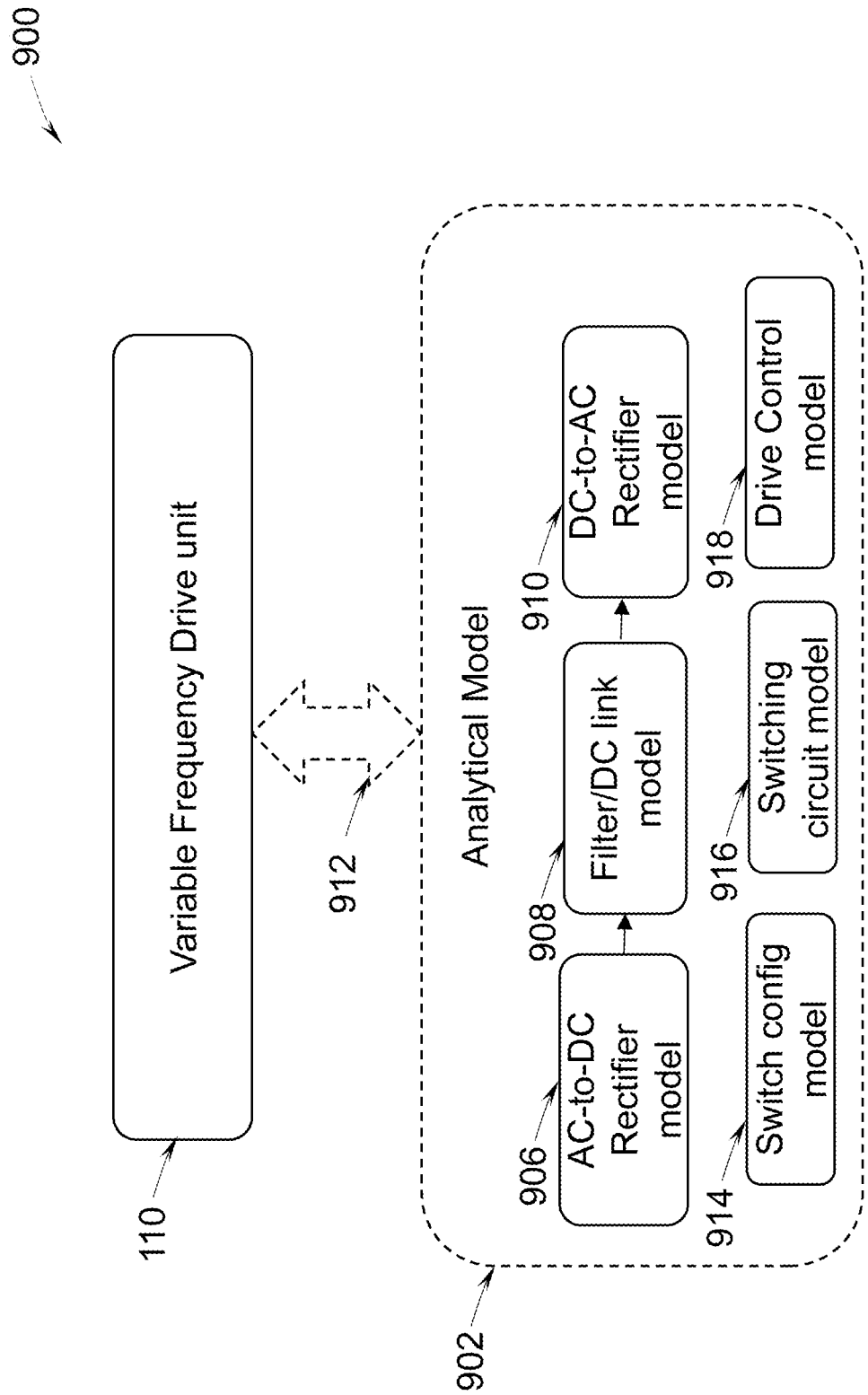
FIG. 9 is an architecture of a digital motor drive system corresponding to the motor drive system of FIG. 8 in accordance with aspects of the present specification.

FIG. 9 illustrates an architecture 900 of the digital motor drive system 110a of FIG. 8 in accordance with aspects of the present specification. The architecture 900 includes an analytical model 902 as an embodiment of the generalized model 302 of FIG. 3. The architecture 900 symbolically illustrates communication of the analytical model 902 with the physical motor drive system 800 by a double arrow 912. In the illustrated embodiment, the analytical model 902 includes an alternating current (AC) to direct current (DC) rectifier model 906 representative of an input AC to DC rectifier in the variable frequency drive unit and configured to provide a rectified electrical signal. The analytical model 902 further includes a filter model 908 communicatively coupled to the AC to DC rectifier model 906 and configured to perform filtering operation on the rectified electrical signal. The filter model 908 is representative of filtering circuitry of the physical motor drive system 110. The filter model is configured to change at least one of a current value, a voltage value of the direct electrical parameters. The analytical model 902 further includes a DC-to-AC rectifier model 910 communicatively coupled to the filter model 908 and configured to generate variable frequency drive output signal. The DC-to-AC converter model is configured to select a frequency value and generate an alternating electrical parameter corresponding to the selected frequency value. The analytic model 902 further includes other models such as, but not limited to, a switch configuration model 914, a switching circuit model 916, and a drive control model 918 to characterize the digital variable frequency drive unit 110a as an equivalent of the physical motor drive system 110.

Figure 10:
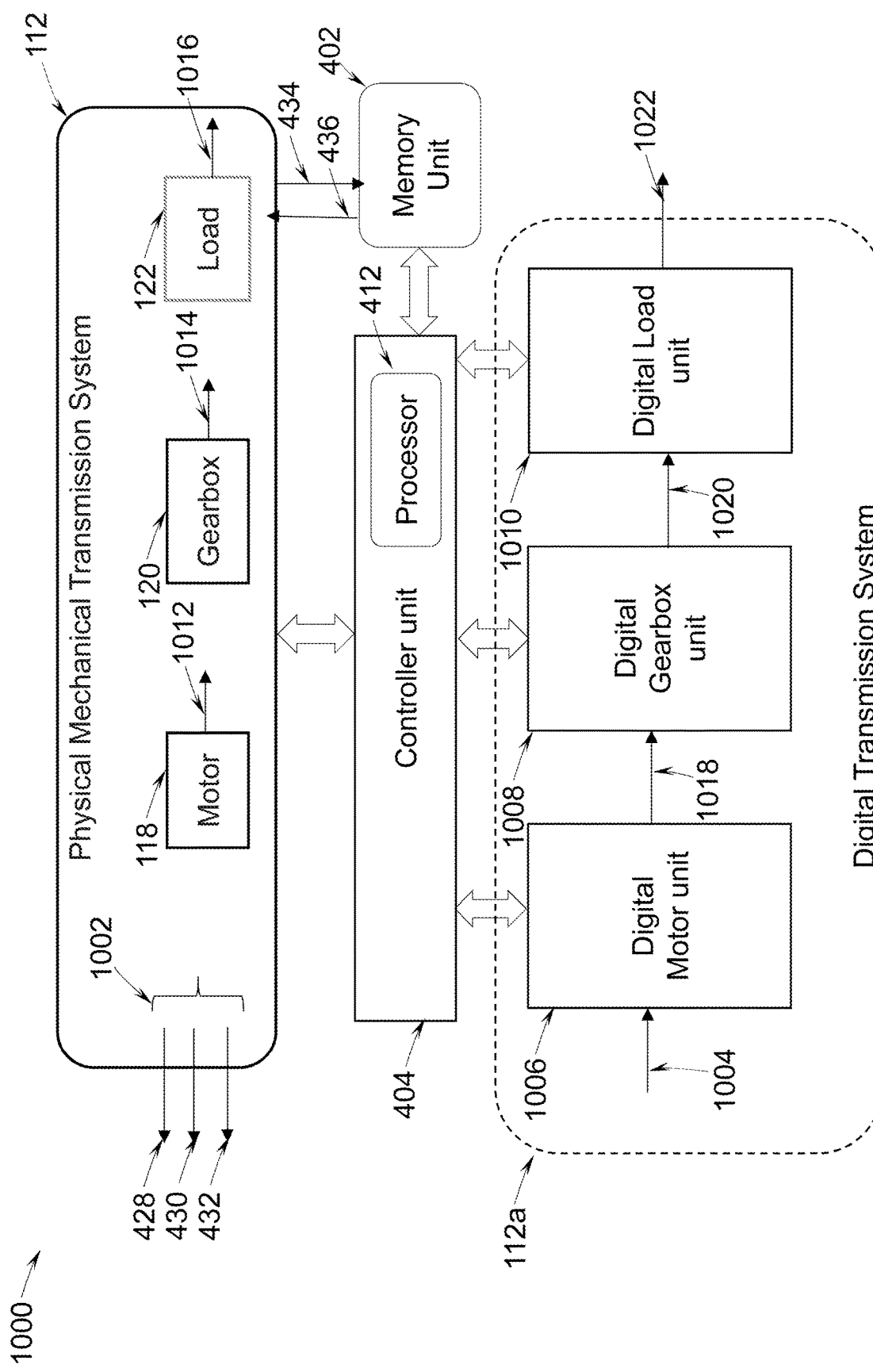
FIG. 10 is a block diagram illustrating a mechanical transmission system in accordance with aspects of the present specification.

FIG. 10 is a block diagram of a mechanical transmission system 1000 in accordance with an aspect of the present specification. In the illustrated embodiment, the mechanical transmission system 1000 the physical mechanical transmission system 112 and a digital drive train system 112a. The mechanical transmission system 1000 includes the motor 118 and the gearbox 120 driven by the motor 118. The motor 118 is driven by a motor drive coupled to a power source. Further, the gear train system includes the load 122 coupled to the gearbox 120. The mechanical transmission system is configured to receive motor drive data and generate motor-load data 1002. In one embodiment, the motor-load data 1002 includes a plurality of motor parameters 1012 corresponding to the motor 118, a plurality of gearbox parameters 1014 corresponding to the gearbox 120 and a plurality of load parameters 1016 corresponding to the load 122. Specifically, the motor parameters 1012 includes a plurality of motor input parameters 1004 and a plurality of motor output parameters. The motor 118 is configured to receive the plurality of motor input parameters and generate the plurality of output parameters. The mechanical transmission system further includes a digital motor unit 1006 communicatively coupled to a motor drive and configured to receive one or more of the plurality of motor input parameters. The digital motor unit 1006 is further configured to generate motor output parameter estimates 1018 of one or more of the plurality of motor parameters 1012. The digital motor unit 1006 is a real-time operational model of the motor 118 coupled to the motor drive and configured to generate a torque. The gearbox 120 is configured to receive the one or more motor parameters 1012 from the motor 118 or its estimates 1018 and generate one or more gearbox parameters 1014 corresponding to the gearbox 120. The gearbox 120 is disposed between the motor 118 and the load 122. The gearbox 120 is further configured to drive the load 122 based on the one or more gearbox parameters 1014. The mechanical transmission system includes a digital gearbox unit 1008 unit communicatively coupled to the digital motor unit 1006 and configured to receive motor parameter estimates 1018 from digital motor unit 1006 and generate gearbox parameter estimates 1020 of one or more of the gearbox parameters 1014. The digital gearbox unit 1008 is a real-time operational model of the gearbox 120. The mechanical transmission system further includes a digital load unit 1010 communicatively coupled to the digital gearbox unit 1008 and configured to receive one or more motor parameter estimates 1018 from the digital gearbox unit 1008. The digital load unit 1010 is further configured to generate load parameter estimates 1022 of one or more load parameters 1016. The digital load unit 1010 is a real-time operational model of the load 122. The mechanical transmission system further includes the controller unit 404 communicatively coupled to at least one of the digital motor unit 1006, the digital gearbox unit 1008 and the digital load unit 1010 and configured to control one or more aspects of the operation of the mechanical transmission system based on one or more of the motor-load data, the motor parameter estimates 1018, the gearbox parameters estimates 1020 and the load parameter estimates 1022.

In one embodiment, the at least one of the digital motor drive system, digital motor unit, digital gearbox unit and the digital load unit is provided by a cloud service. In one embodiment, the motor-load data includes a line voltage, a line current and a temperature value. Further, the motor-load data also includes a vibration value corresponding to the load, and an oil quality value corresponding to gearbox oil.

In one embodiment, the motor-load data 1002 includes environmental data 428, the design data 430 and the inspection data 432 corresponding to the mechanical transmission system. Further, the motor-load data 1002 includes operation data 434 and the historical data 436 corresponding to the mechanical transmission system.

In one embodiment, the controller unit 404 is configured to estimate performance of at least one of the motor 118, the gearbox 120, and the load 122 based on the motor-load data 1002, the motor parameter estimates 1018, the gearbox parameter estimates 1020 and the load parameter estimates 1022. Specifically, the controller unit 404 is configured to determine a current total harmonic distortion (THD), a current root mean square (RMS) corresponding to a motor current or a load current, a voltage RMS corresponding to a motor voltage and a load voltage, a speed of a rotating component of the mechanical transmission system, an energy usage of the load.

Also, the controller unit 404 is configured to determine at least one fault in a stator, a rotor, an electrical component, a mechanical component. Specifically, the controller unit 404 is configured to determine at least one of a stator turn fault, a broken rotor bar fault, a rolling element bearing fault, an eccentricity, a shaft misalignment, a foundation bolt fault, power switch fault, an IGBT fault, a drive control fault, drive insulation fault, overheating fault, DC bus fault, capacitor fault, impeller fault, blade fault, excessive vibration fault, gear wheel fault and bearing fault. The controller unit 404 is also configured to control operation of the mechanical transmission system based on type of the determined fault and severity of the determined fault.

In another embodiment, the controller unit 404 is further configured to derive health assessment of at least one of the motor, the gearbox and the load of the drive train unit based on the motor-load data. In a further embodiment, the controller unit 404 is configured to design at least one of the digital motor unit 1006, digital gearbox unit 1008 and the digital load unit 1010 based on the operational data and the historical data corresponding to the mechanical transmission system. The controller unit 404 is configured to use a learning technique such as, but not limited to, a machine learning and a deep learning technique to design the digital units 1006, 1008, 1010 based on historical drive train data. In one embodiment, the controller unit 404 is further configured to modify at least one of the digital motor unit 1006, the digital gearbox unit 1008 and the digital load unit 1010 based on the motor-load data 1002. During operation, the controller unit 404 is also configured to regulate operation of at least one of the motor 118, the gearbox 120 and the load 122.

In one embodiment, the non-transitory computer readable medium having instructions to enable at least one processor to control a mechanical transmission system is disclosed. The instructions enable the at least one processor to receive motor-load data corresponding to a mechanical transmission system. The mechanical transmission system includes a motor and a load driven by the motor. The motor-load data includes a plurality of motor parameters 1012 and a plurality of load parameters 1016. The instructions further enable the at least one processor to enable the digital motor unit to receive one or more motor input parameters. The digital motor unit is a real-time operational model of the motor configured to generate a torque. The instructions further enable the at least one processor to generate motor parameter estimates 1018 of one or more of the plurality of motor parameters 1012. The instructions also enable the at least one processor to enable the digital load unit to receive one or more motor parameter estimates from the digital motor unit. The digital load unit is a real-time operational model of the load. The instructions enable the at least one processor to control the digital load unit to generate load parameter estimates 1022 corresponding to one or more load parameters. The instructions also enable the at least one processor to control operation of the mechanical transmission system based on one or more of the motor-load data, motor parameter estimates 1018 and load parameter estimates 1022.

Figure 11:
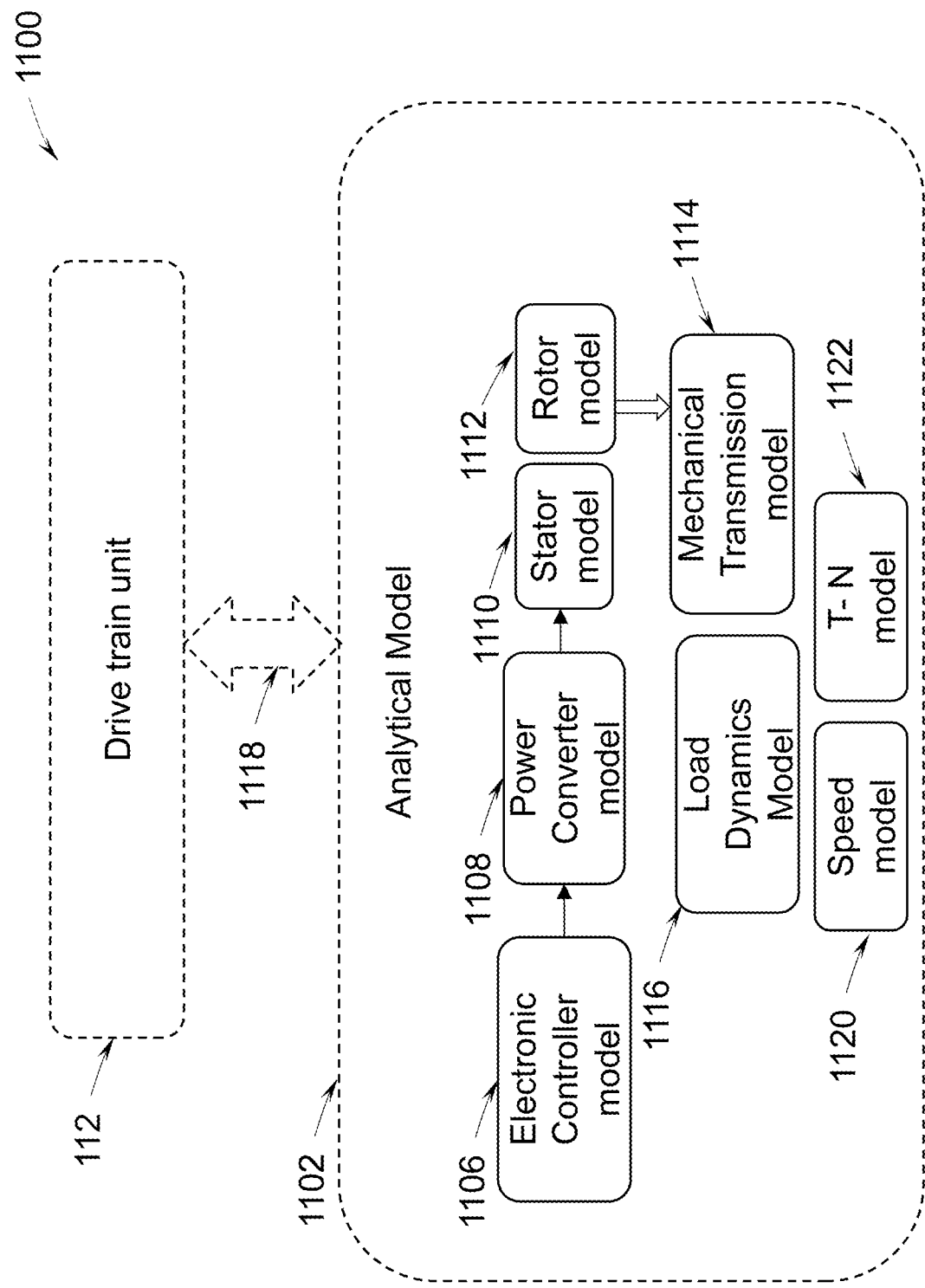
FIG. 11 is an architecture of a digital drive train system corresponding to the mechanical transmission system of FIG. 10 in accordance with aspects of the present specification.

FIG. 11 illustrates an architecture 1100 of the digital drive train system 112a in accordance with aspects of the present specification. The architecture 1100 provides details of an analytical model 1102 corresponding to the digital drive train system 112a. The analytical model 1102 is an example of the analytical model 1102 in the general architecture of FIG. 3. Further, in the present embodiment, the physical mechanical transmission system 112 corresponds to a drive train unit and the digital drive train system 112a corresponds to a digital equivalent of the drive train unit. The architecture 1100 symbolically illustrates communication of the analytical model 1102 with the physical drive train unit by a double arrow 1118. In the illustrated embodiment, the analytical model 1102 includes a motor model having a stator model 1110 and a rotor model 1112. The stator model 1110 is representative of structural properties, electrical properties and magnetic properties of the stator of the physical mechanical transmission system 1000. The rotor model 1112 is representative of structural features, electrical and magnetic properties of the rotor in the mechanical transmission system 1000. The motor model further includes an electronic controller model 1106 communicatively coupled to the motor model and configured to represent control mechanism of the motor. The analytical model 1102 further includes a mechanical transmission model 1114 communicatively coupled to the rotor model 1112 and configured to represent functioning of gear box of the mechanical transmission system 1000. The analytical model 310 further includes a load dynamics model 1116 communicatively coupled to the other components of the digital drive train system 112a and configured to simulate dynamics corresponding to load of the mechanical transmission system 1000. The analytical model 310 further includes other models such as, but not limited to, a power converter model 1108, a speed model 1120, and a T-N model 1122 required to characterize the digital drive train unit 112 as an equivalent of the mechanical transmission system 1000.

Figure 12:
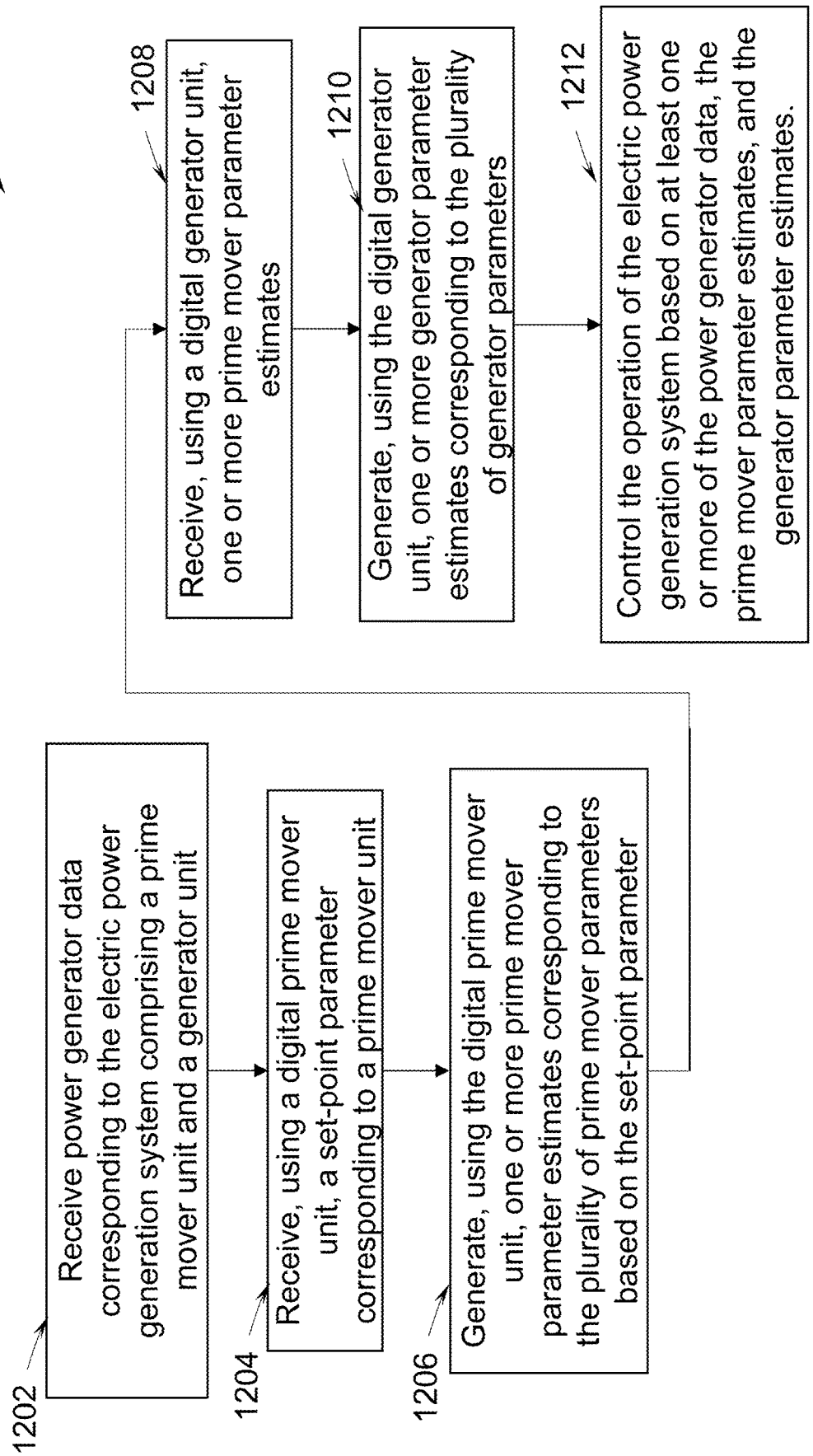
FIG. 12 is a flow chart of a method for controlling the power generation system of FIG. 4 in accordance with aspects of the present specification.

FIG. 12 is a flow chart of a method 1200 for controlling operation of an electric power generation system of FIG. 4 in accordance with one aspect of the present specification. The method 1200 includes receiving power generator data corresponding to the electric power generation system at step 1202. In particular, the controller unit receives the power generator data from an internal memory of the power generation unit or from a memory unit that is coupled to the controller unit. In one embodiment, the power generation system includes a prime mover unit and a generator unit coupled to the prime mover unit. The power generator data includes a plurality of prime mover parameters corresponding to the prime mover unit, and a plurality of generator parameters corresponding to the generator unit. The power generator data further includes environmental data, design data, operational data, historical data, and inspection data corresponding to the electric power generation system. The environmental data includes parameters related to atmospheric conditions in which the power generation system operates. In this embodiment, the environmental parameters include, but not limited to, an ambient temperature value, a humidity value, an internal temperature value and an internal pressure value. The design data corresponds to design parameters corresponding to the power generation system provided by the manufacturer. The inspection data corresponds to data gathered during inspection of the power generation system. In one embodiment, the plurality of prime mover parameters includes a set-point and parameters from the prime mover nameplate information. The plurality of generator parameters includes, but not limited to, a current total harmonic distortion (THD), a current root mean square (RMS) value, voltage THD, energy usage.

The method further includes receiving by a digital prime mover unit, the set-point parameter corresponding to a prime mover unit at step 1204. The digital prime mover unit is real-time operational model of the prime mover unit. The method 1200 further includes generating by the digital prime mover unit, one or more prime mover parameter estimates corresponding to the plurality of prime mover parameters based on the set-point parameter in step 1206. The method 1200 also includes receiving, using a digital generator unit, one or more prime mover parameter estimates at step 1208. The digital generator unit is a real-time operational model of the generator unit. Further, at step 1210, the method 1200 includes generating, using the digital generator unit, one or more generator parameter estimates corresponding to the plurality of generator parameters. In one embodiment, the digital prime mover unit and the digital generator unit are designed based on the historical data using learning techniques such as deep learning methods.

The method 1200 also includes controlling the operation of the electric power generation system based on at least one or more of the power generator data, the prime mover parameter estimates, and the generator parameter estimates at step 1212. Specifically, controlling step includes determining a power generation system fault such as, but not limited to, a stator insulation fault, bearing defects, eccentricity, field winding insulation faults, prime mover faults, turbine blade defects, bearing defects, diesel engine misfiring, valve misposition, overheating, excessive vibrations. Further, performance of at least one of the prime mover unit and the generator unit is determined based on the power generator data. In one embodiment, health assessment of at least one of the prime mover unit and the generator unit is determined based on the power generator data, type of power generation system fault and severity of the power generation system fault. Further, the controlling step 1212 also includes operating the power generation system based on the assessed health and the performance of at least one of the prime mover unit and the generator unit. In one embodiment, the controlling step 1212 further includes modifying at least one of the prime mover unit and the generator unit based on the operational data, power generator data and the power generation system fault. Further, in one embodiment, the controlling also includes determining a replacement condition corresponding to the prime mover based on the assessed health condition of the prime mover and prime mover faults. Further, replacement condition corresponding to the generator unit may also be determined based on health assessment of the generator unit and generator faults. The controlling step 1212 further includes generating a recommendation for selecting the prime mover and/or the generator unit based on the replacement condition. The controlling step also includes assessing health of at least one of the prime mover unit and the generator unit based on the power generator data.

Figure 13:
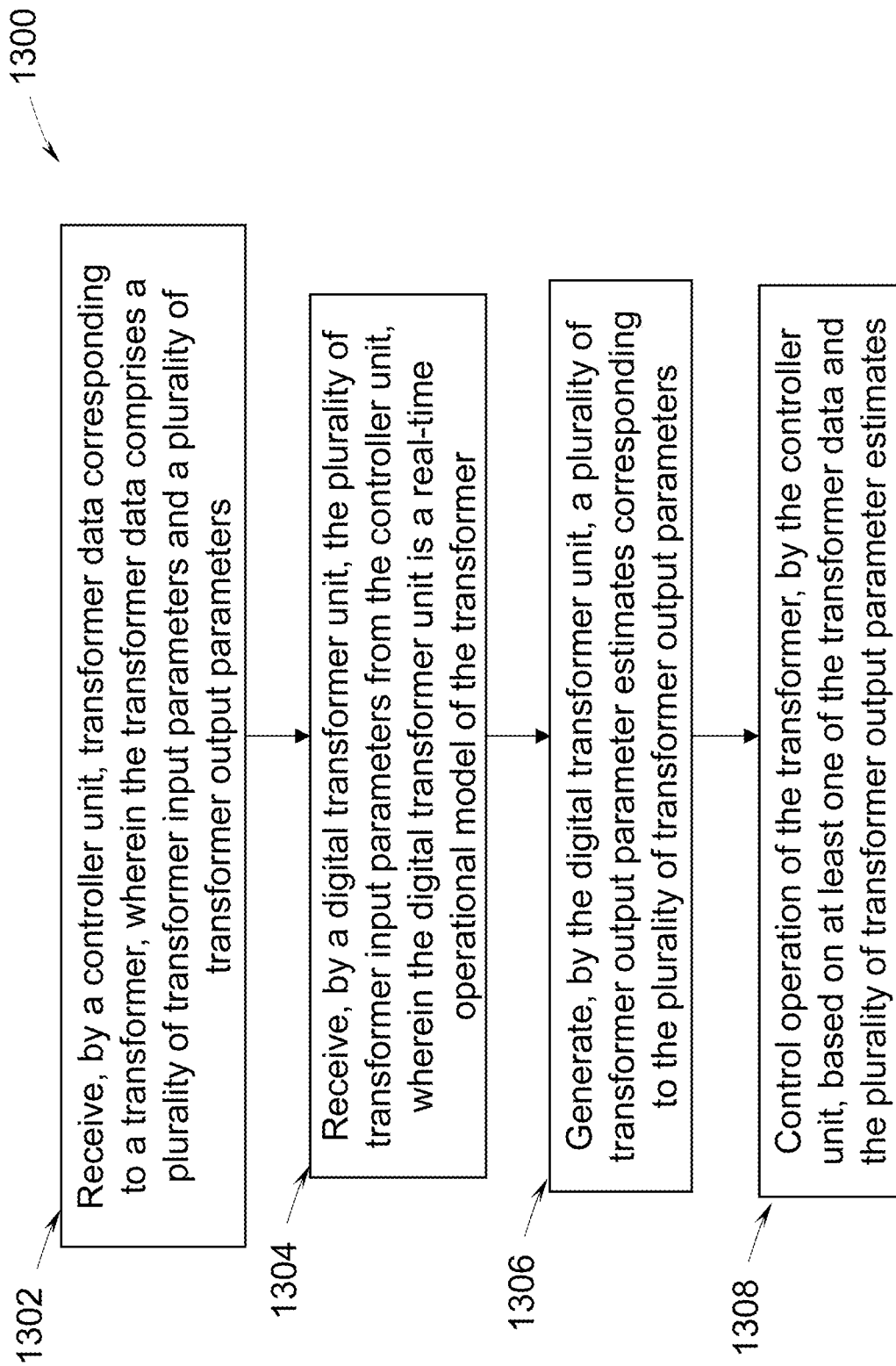
FIG. 13 is a flow chart of a method for controlling the transformer system of FIG. 6 in accordance with aspects of the present specification.

FIG. 13 is a flow chart of a method 1300 for controlling the transformer system of FIGS. 6 and 7 in accordance with one aspect of the present specification. The method 1300 includes receiving, by a controller unit, transformer data corresponding to a transformer as illustrated at step 1302. In particular, the controller unit receives the transformer data from an internal memory of the transformer system or from a memory unit that is coupled to the controller unit. The transformer data includes a plurality of transformer input parameters and a plurality of transformer output parameters. The plurality of transformer input parameters includes a first line voltage, a first line current. The plurality of transformer output parameters includes a second line voltage and a second line current.

The method 1300 further includes receiving, by a digital transformer system, the plurality of transformer input parameters from the controller unit as illustrated at step 1304. The digital transformer system is a real-time operational model of the transformer. At step 1306, the method includes generating, by the digital transformer system, a plurality of transformer output parameter estimates corresponding to the plurality of transformer output parameters, based on the transformer data. In one example, the digital transformer system may employ machine learning technique to generate the transformer output parameter estimates. The method 1300 also includes controlling operation of the transformer, by the controller unit, based on at least one of the transformer data and the plurality of transformer output parameter estimates at step 1308. In one embodiment, the controller unit may determine a transformer fault based on the transformer data and the transformer output parameter estimates. For example, the transformer fault may be insulation degradation or over-heating of transformer windings. Further, the controller unit may control the operation of the transformer to control the insulation degradation or over-heating of the transformer windings.

Figure 14:
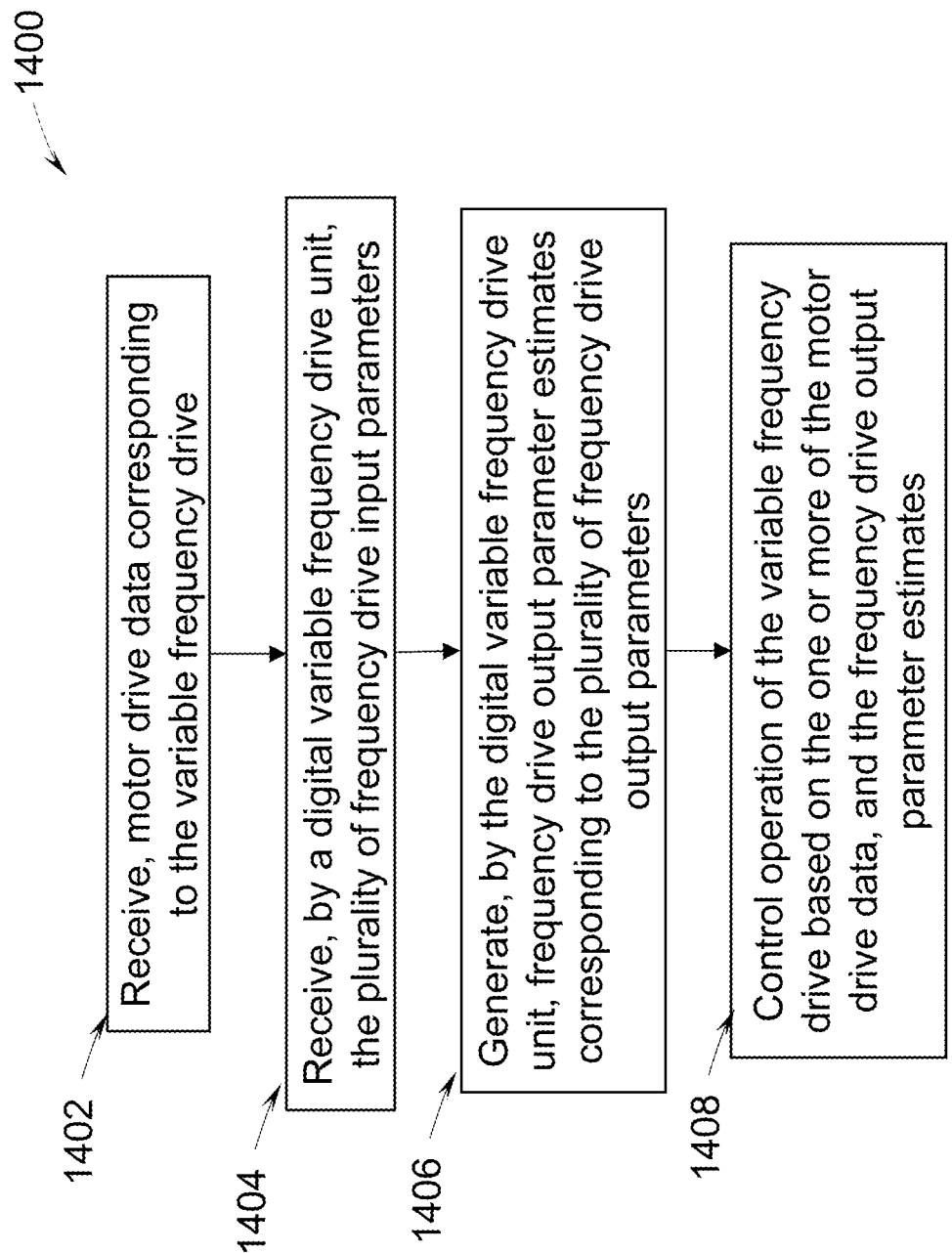
FIG. 14 is a flow chart of a method for controlling the motor drive system of FIG. 8 in accordance with aspects of the present specification.

FIG. 14 illustrates a flow chart of a method 1400 for controlling operation of a motor drive system of FIG. 8 in accordance with one aspect of the present specification. In this embodiment, the motor drive system includes a variable frequency drive unit and a digital variable frequency drive unit. The method 1400 includes receiving motor drive data corresponding to a variable frequency drive at step 1402. In particular, the controller unit receives the motor drive data from an internal memory of the variable frequency drive unit or from a memory unit that is coupled to the controller unit. The motor drive data includes a plurality of frequency drive input parameters and a plurality of frequency drive output parameters. In one embodiment, the motor drive data further includes environmental data, design data, operational data, historical data, and inspection data corresponding to the variable frequency drive. Specifically, the environmental data includes parameters such as, but not limited to, an ambient temperature value, a humidity value in which the motor drive system operates. The design data corresponds to design parameter values of the motor drive system provided by manufacturer. The inspection data includes parameter values recorded during inspection of the motor drive system during routine maintenance schedule. The motor drive data obtained during the operation of the motor drive is included in the operational data. The historical data includes the motor drive data corresponding to previous time instants stored in the memory unit. Further, in one embodiment, the plurality of frequency drive input parameters includes, but not limited to, a first line voltage, a first line current, a first frequency value and the plurality of frequency drive output parameters includes a second line voltage, a second line voltage, a second frequency value.

The method 1400 further includes receiving, by a digital variable frequency drive unit, the plurality of frequency drive input parameters at step 1404. The method also includes generating frequency drive output parameter estimates using the digital variable frequency drive unit in step 1406. Further, at step 1408 of the method 1400, operation of the variable frequency drive is controlled based on the one or more of the motor drive data and the frequency drive output parameter estimates. Further, performance of the variable frequency drive unit may also be determined based on the plurality of frequency drive input parameter and the plurality of frequency drive output parameters in step 1408. Specifically, in one embodiment, the controlling step 1408 includes determining a motor drive fault such as, but not limited to, a power switch failure, an insulated-gate bipolar transistor (IGBT) failure, a drive control failure, a drive insulation failure, an overheating failure, a direct current (DC) bus failure, and a capacitor failure. A health assessment of the variable frequency drive is generated based on the motor drive data and any detected motor drive faults. In one embodiment, operation of the variable frequency drive may be regulated based on the assessed motor drive health and the motor drive fault. In one embodiment, the digital variable frequency drive unit is modified based on the motor drive data using one or more adaptive learning techniques. In an embodiment, when a fault is detected in the variable frequency drive, a replacement decision is generated based on type of the motor drive fault and severity of the motor drive fault. In such an embodiment, the controlling includes generating a recommendation to select between an IGBT based frequency drive and metal-oxide-semiconductor field-effect transistor (MOSFET) based frequency drive.

Figure 15:
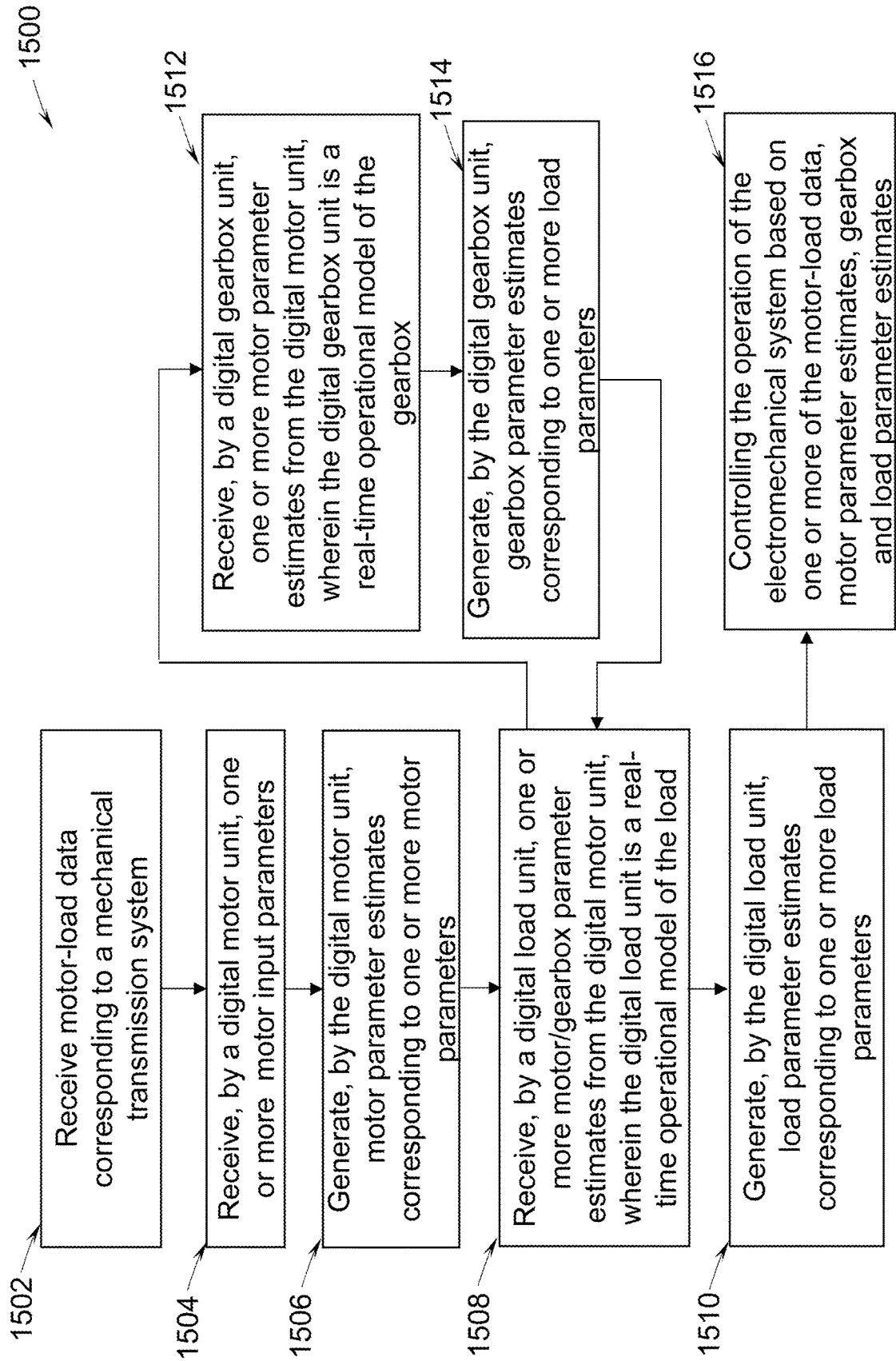
FIG. 15 is a flow chart of a method for controlling the mechanical transmission system of FIG. 10 in accordance with aspects of the present specification.

FIG. 15 illustrates a flow chart of a method 1500 for controlling the mechanical transmission system of FIG. 10 in accordance with one aspect of the present specification. The method of controlling an operation of the mechanical transmission system includes receiving motor-load data corresponding to the mechanical transmission system at step 1502. In particular, the controller unit receives the motor-load data from an internal memory of the drive train unit or from a memory unit that is coupled to the controller unit. The mechanical transmission system includes a motor and a load driven by the motor. Further, the motor-load data includes a plurality of motor parameters and a plurality of load parameters. In one embodiment, the mechanical transmission system further includes a gearbox unit in between the motor unit and the load unit. In such an embodiment, the motor-load data also includes a plurality of gearbox parameters. Further, it may be noted that the motor-load data further includes environmental data, design data, operational data, historical data, and inspection data corresponding to the mechanical transmission system. Specifically, the environmental data may include an ambient temperature value, a humidity value and other such atmospheric parameter values experienced by the mechanical transmission system. The design data includes manufacturer provided data corresponding to the mechanical transmission system. The inspection data includes parameters recorded during routine maintenance and inspection schedules corresponding to the mechanical transmission system. The historical data includes operational and other data related to the mechanical transmission system corresponding to the previous time instants. Specifically, the motor-load data may include one or more of, but is not necessarily limited to, an electrical parameter, a temperature value, a vibration value, a frequency value corresponding to the electrical parameter, a speed value corresponding to a rotating component in the mechanical transmission system, an energy usage by the load, an oil quality value corresponding to gearbox oil and a temperature value. In some embodiments, the motor-load data may include all of the parameters enumerated above.

The method 1500 further includes receiving, by a digital motor unit, one or more motor input parameters at step 1504. The digital motor unit is a real-time operational model of the motor configured to generate a torque. At step 1506, the method 1500 also includes generating, by the digital motor unit, motor parameter estimates corresponding to one or more motor parameters.

In one embodiment, at step 1508 of method 1500, one or more motor parameter estimates are received by a digital load unit from the digital motor unit. The digital load unit is a real-time operational model of the load. Further, at step 1510, the method includes generating load parameter estimates corresponding to the one or more load parameters. In this embodiment, after the step 1510, the control is transferred to step 1516 of method 1500. In another embodiment, at step 1510 of method 1500, the transfer is transferred to step 1512 where the motor parameter estimates from the digital motor unit are received by a digital gearbox unit. The digital gearbox unit is a real-time operational model of the gearbox unit. In such an embodiment, the step 1514 includes generating, by the digital gearbox unit, gearbox parameter estimates corresponding to one or more gearbox parameters. Further, in this embodiment, the control is transferred to step 1508. In both embodiments, after the step 1510, the control is transferred to step 1516 where the method 1500 further includes controlling the operation of the mechanical transmission system.

Specifically, at step 1516, the controlling is based on one or more of the motor-load data, motor parameter estimates and load parameter estimates. Specifically, the controlling step 1516 includes determining one or more performance parameters corresponding to the mechanical transmission system. It may be noted that some of the parameters of the motor-load data may also be used as performance parameters. In one embodiment, a motor-load system fault such as, but not limited to, a stator turn fault, a broken rotor bar fault, a rolling element bearing fault, an eccentricity, a shaft misalignment, a foundation bolt fault, overheating fault, DC bus fault, capacitor fault, impeller fault, blade fault, excessive vibration fault, gear wheel fault and bearing fault are determined based on the motor-load data and the performance parameters.

In one embodiment, the performance parameter may be used to determine performance of the motor-load system or one of its units. In another embodiment, the motor-load system is regulated based on the performance parameters and the motor-load fault. In some embodiments, controlling also includes identifying a replacement condition corresponding to at least one of the motor, the gearbox and the load based on type of the motor-load fault and severity of the motor-load fault. The controlling also includes generating a recommendation to replace one or more of the motor and the gearbox based on the replacement condition.

In one embodiment, the digital motor unit, the digital gearbox unit and the digital load unit are determined based on the operational data and the motor-load data using machine learning technique such as deep learning methods. During operation, at least one of the digital motor unit and the digital gearbox unit are modified based on the motor-load data using one or more adaptive learning techniques. In one embodiment, operation of the motor unit, the gearbox unit and the load unit is regulated based on one or more of assessed health, performance or fault of the motor-load system.

It is to be understood that not necessarily all such objects or advantages described above may be achieved in accordance with any particular embodiment. Thus, for example, those skilled in the art will recognize that the systems and techniques described herein may be embodied or carried out in a manner that achieves or improves one advantage or group of advantages as taught herein without necessarily achieving other objects or advantages as may be taught or suggested herein.

While the technology has been described in detail in connection with only a limited number of embodiments, it should be readily understood that the specification is not limited to such disclosed embodiments. Rather, the technology can be modified to incorporate any number of variations, alterations, substitutions or equivalent arrangements not heretofore described, but which are commensurate with the spirit and scope of the claims. Additionally, while various embodiments of the technology have been described, it is to be understood that aspects of the specification may include only some of the described embodiments. Accordingly, the specification is not to be seen as limited by the foregoing description, but is only limited by the scope of the appended claims.

The invention claimed is:

1. A method comprising:
   receiving, by a controller unit, transformer data corresponding to a transformer, wherein the transformer data comprises a plurality of transformer input parameters and a plurality of transformer output parameters;
   receiving, by a digital transformer unit, the plurality of transformer input parameters from the controller unit, wherein the digital transformer unit is a real-time operational model of the transformer;
   generating, by the digital transformer unit, a plurality of transformer output parameter estimates corresponding to the plurality of transformer output parameters;

modifying, by the controller unit, one or more parameters of the transformer data; and controlling operation of the transformer, by the controller unit, based on at least one of the transformer data and the plurality of transformer output parameter estimates.

2. The method of claim 1, wherein the transformer data further comprises environmental data, design data, operational data, historical data, inspection data related to the transformer, data from name plate information, a temperature, a leakage current, a partial discharge (PD), an energy usage, a current total harmonic distortion (THD), and a voltage total harmonic distortion (THD).

3. The method of claim 2, wherein a first signal corresponding to the plurality of transformer input parameters is transmitted from the digital transformer unit to the controller unit via a cloud service and a second signal corresponding to the plurality of transformer input parameters is transmitted from the controller unit to the digital transformer unit via the cloud service.

4. The method of claim 2, wherein the plurality of transformer input parameters comprises at least one of a first line voltage and a first line current, and wherein the plurality of transformer output parameters comprises at least one of a second line voltage and a second line current.

5. The method of claim 4, wherein controlling operation of the transformer comprises:
assessing health of the transformer based on the plurality of transformer input parameters and the plurality of transformer output parameter estimates; and
operating the transformer based on the health assessment.

6. The method of claim 5, wherein controlling operation of the transformer further comprises selecting a replacement transformer for replacement based on the plurality of transformer input parameters, the plurality of transformer output parameter estimates, and historical transformer data using a machine learning technique.

7. The method of claim 5, further comprising: regulating operation of at least one of:
a first electrical subsystem configured to provide the plurality of transformer input parameters to the controller unit; and
a second electrical subsystem configured to receive the plurality of transformer output parameters from the transformer.

8. The method of claim 2, wherein controlling operation of the transformer further comprises optimizing the operation of the transformer based on the plurality of transformer input parameters and the plurality of transformer output parameter estimates.

9. The method of claim 8, wherein the optimizing the operation of the transformer further comprises controlling at least one of an insulation degradation, an over-heating, a tap position, an oil quality, and an oil level in the transformer.

10. A transformer system comprising:
a transformer configured to be coupled to a first electrical subsystem and a second electrical subsystem and configured to generate transformed electrical parameters characterized by transformer data, wherein the transformer data comprises a plurality of transformer input parameters and a plurality of transformer output parameters;
a digital transformer unit configured to be coupled to the transformer, wherein the digital transformer unit is a real-time operational model of the transformer, and wherein the digital transformer unit is configured to:
receive the plurality of transformer input parameters; and generate transformer output parameter estimates corresponding to the plurality of transformer output parameters; and
a controller unit configured to be coupled to the digital transformer unit and wherein the controller unit is configured to:
modify one or more parameters of the transformer data; and
control operation of the transformer based on at least one of the transformer data and the plurality of transformer output parameter estimates.

11. The transformer system of claim 10, wherein a first signal corresponding to the plurality of transformer input parameters is transmitted from the digital transformer unit to the controller unit via a cloud service and a second signal corresponding to the plurality of transformer input parameters is transmitted from the controller unit to the digital transformer unit via the cloud service.

12. The transformer system of claim 10, wherein the transformer data further comprises environmental data, design data, operational data, historical data, and inspection data corresponding to the transformer, data from name plate information, a temperature, a leakage current, and a partial discharge (PD), an energy usage, a current total harmonic distortion (THD), and a voltage total harmonic distortion (THD).

13. The transformer system of claim 12, wherein the plurality of transformer input parameters comprises at least one of a first line voltage and a first line current, and wherein the plurality of transformer output parameters comprises at least one of a second line voltage and a second line current.

14. The transformer system of claim 13, wherein the controller unit is further configured to:
assess health of the transformer based on the plurality of transformer input parameters and the plurality of transformer output parameter estimates; and
operate the transformer based on the health assessment.

15. The transformer system of claim 14, wherein the controller unit is configured to control operation of the transformer by selecting a replacement transformer for replacement based on the plurality of transformer input parameters, the plurality of transformer output parameter estimates, and historical transformer data using a machine learning technique.

16. The transformer system of claim 14, wherein the controller unit is further configured to regulate operation of at least one of:
the first electrical subsystem configured to provide the plurality of transformer input parameters to the controller unit; and
the second electrical subsystem configured to receive the plurality of transformer output parameters from the transformer.

17. The transformer system of claim 13, wherein the controller unit is configured to optimize the operation of the transformer based on the plurality of transformer input parameters and the plurality of transformer output parameter estimates.

18. The transformer system of claim 17, wherein the controller unit is configured to optimize the operation of the transformer by controlling at least one of an insulation degradation, an over-heating, a tap position, an oil quality, and an oil level in the transformer.

19. A non-transitory computer readable medium encoded with instructions to enable at least one processor to:
receive, by a controller unit, transformer data corresponding to a transformer, wherein the transformer data comprises a plurality of transformer input parameters and a plurality of transformer output parameters;

receive, by a digital transformer unit, a plurality of transformer input parameters, wherein the digital transformer unit is a real-time operational model of the transformer;

generate, by the digital transformer unit, a plurality of transformer output parameter estimates corresponding to the plurality of transformer output parameters;

modify, by the controller unit, one or more parameters of the transformer data; and control operation of the transformer, by the controller unit, based on at least one of the transformer data and the plurality of transformer output parameter estimates.

\* \* \* \* \*